(12) United States Patent
Patolsky et al.

(10) Patent No.: US 10,636,832 B2
(45) Date of Patent: Apr. 28, 2020

(54) SYSTEM AND METHOD FOR SENSING LIGHT

(71) Applicant: Ramot at Tel-Aviv University Ltd., Tel-Aviv (IL)

(72) Inventors: Fernando Patolsky, Rehovot (IL); Sharon Lefler, Tel-Aviv (IL); Moria Kwiat, Tel-Aviv (IL); Ella Davidi, Tel-Aviv (IL); Omri Heifler, Tel-Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 395 days.

(21) Appl. No.: 15/437,897

(22) Filed: Feb. 21, 2017

(65) Prior Publication Data

US 2017/0243911 A1 Aug. 24, 2017

Related U.S. Application Data

(60) Provisional application No. 62/297,902, filed on Feb. 21, 2016.

(51) Int. Cl.
*H01L 27/146* (2006.01)

(52) U.S. Cl.
CPC .............................. *H01L 27/14645* (2013.01)

(58) Field of Classification Search
CPC ......... H01L 31/035218; H01L 27/1461; H01L 27/14616; H01L 27/14629; H01L 27/14643; H01L 27/14652; H01L 27/14689; H01L 27/14812; H01L 27/14831; H01L 31/022408; H01L 31/02327; H01L 31/035236; H01L 31/1113
See application file for complete search history.

(56) References Cited

U.S. PATENT DOCUMENTS

| | | | | |
|---|---|---|---|---|
| 2005/0093425 A1* | 5/2005 | Sugiyama | .............. | B82Y 10/00 313/495 |
| 2010/0006143 A1* | 1/2010 | Welser | .................. | B82Y 20/00 136/255 |
| 2010/0142259 A1* | 6/2010 | Drndic | .................. | B82Y 10/00 365/158 |
| 2011/0127488 A1* | 6/2011 | Brown | .................. | B82Y 10/00 257/9 |
| 2012/0197364 A1* | 8/2012 | Banin | .................. | A61N 1/0543 607/115 |
| 2015/0362476 A1* | 12/2015 | Clements | ............... | G01N 21/01 506/10 |

* cited by examiner

*Primary Examiner* — Georgia Y Epps
*Assistant Examiner* — Don J Williams

(57) ABSTRACT

A light sensor comprises a nanostructure connectable to a source electrode and a drain electrode, and light sensitive moiety covalently attached to a surface of the nanostructure. The light sensitive moiety comprises a light sensitive molecule having an absorbance spectrum in a visible range. The light sensitive molecule is selected such that upon irradiation of the light sensor by light having a central wavelength within the absorbance spectrum, the sensitive molecule transfers or extracts an electron to or from the surface of the nanostructure.

33 Claims, 23 Drawing Sheets
(20 of 23 Drawing Sheet(s) Filed in Color)

FIG. 6A  FIG. 6B  FIG. 6C
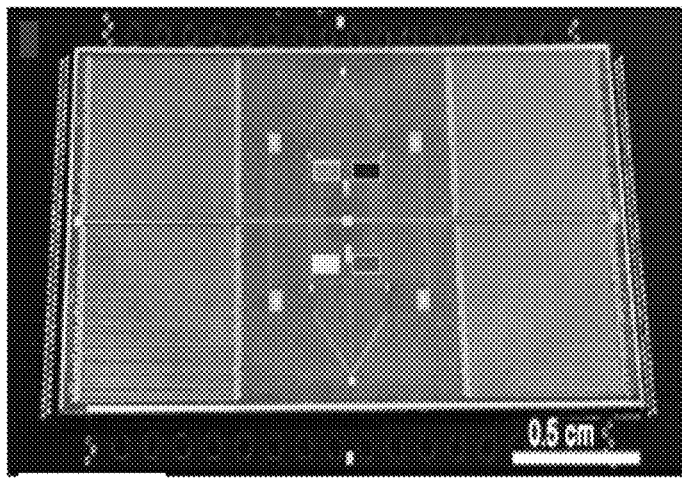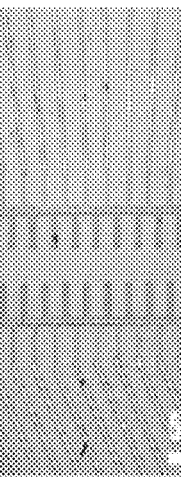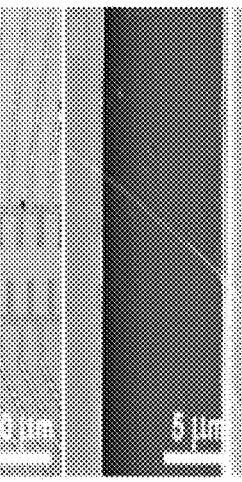
FIG. 6D  FIG. 6E  FIG. 6F  FIG. 6G
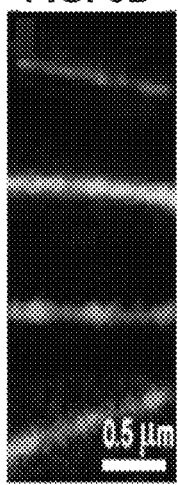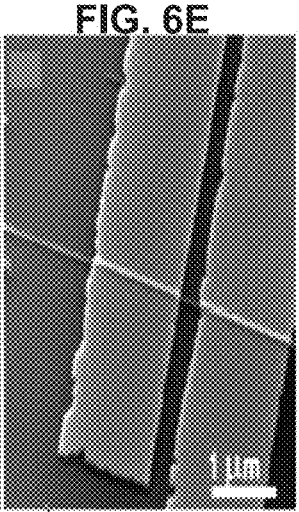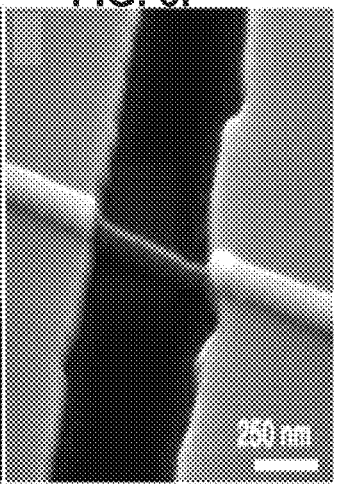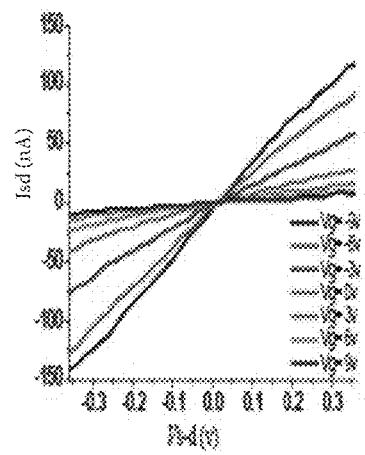
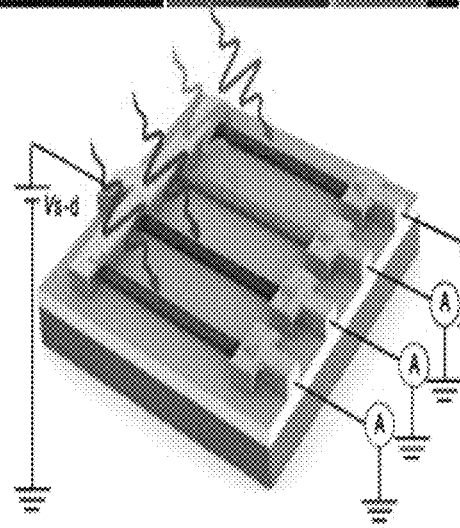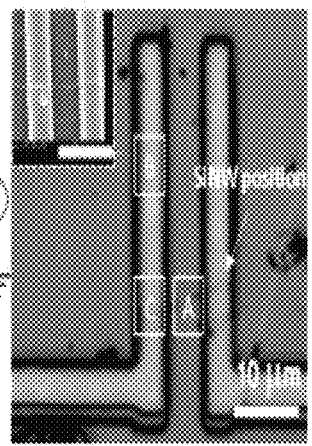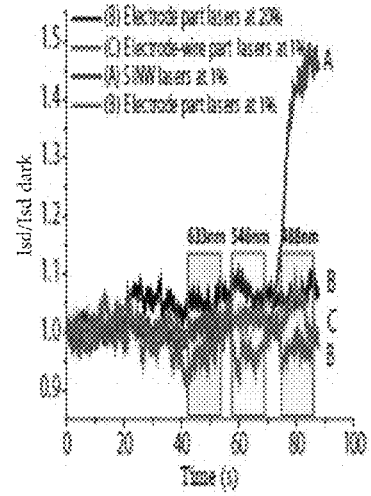
FIG. 6H  FIG. 6I  FIG. 6J

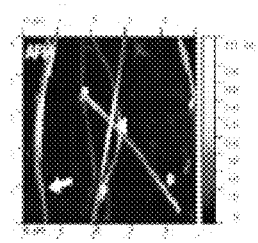
FIG. 8A
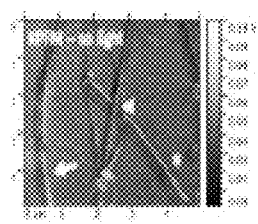
FIG. 8B
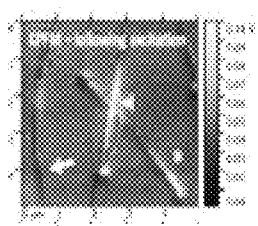
FIG. 8C
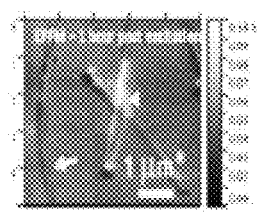
FIG. 8D
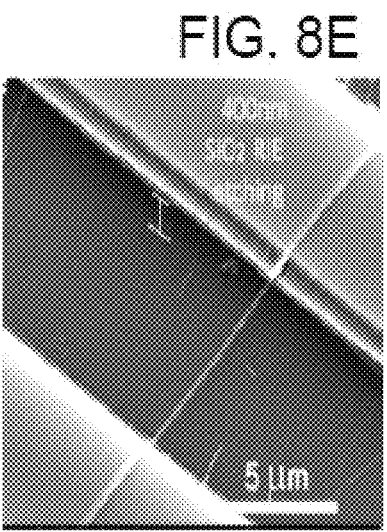
FIG. 8E
FIG. 8F
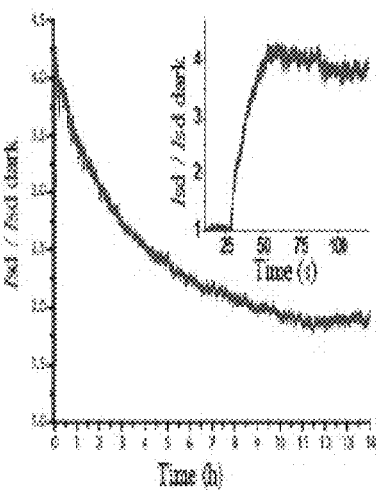
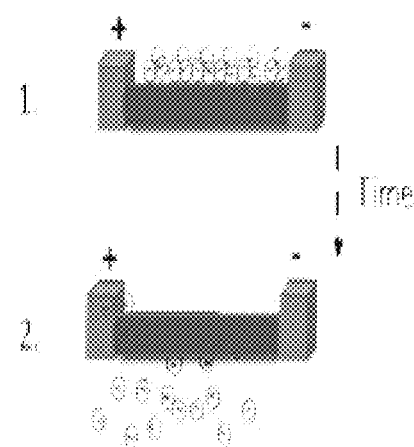
FIG. 8G
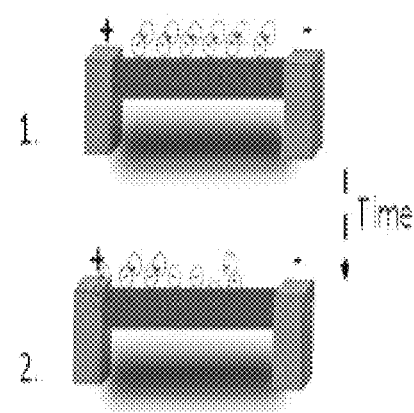
FIG. 8H

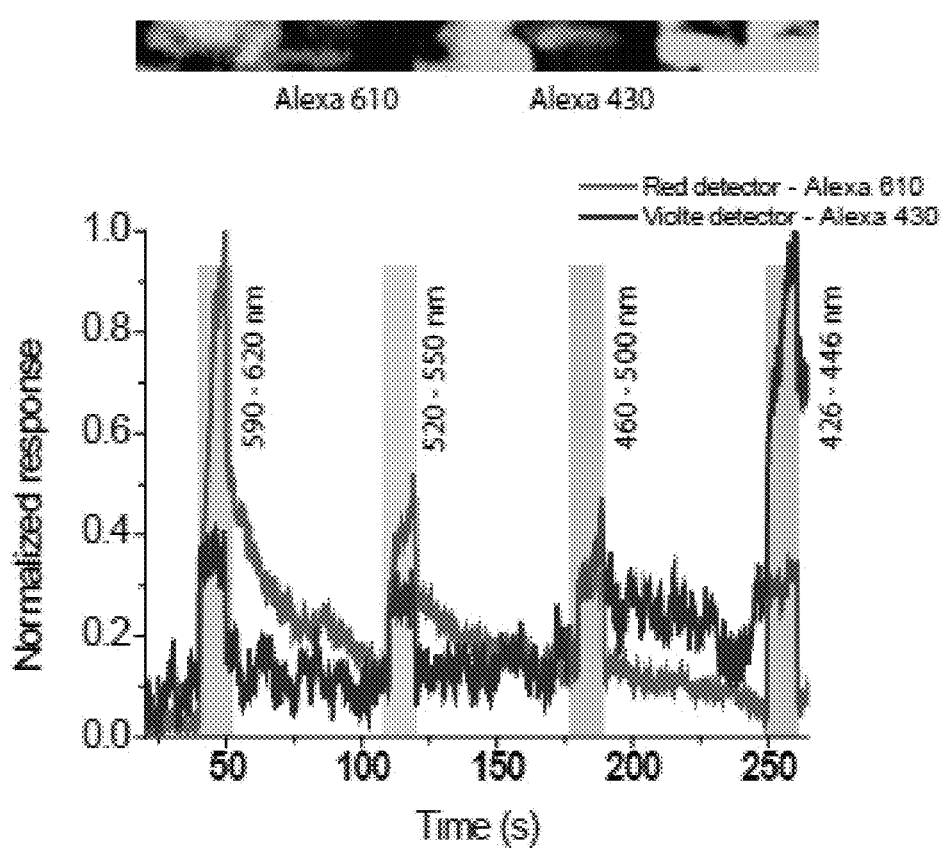

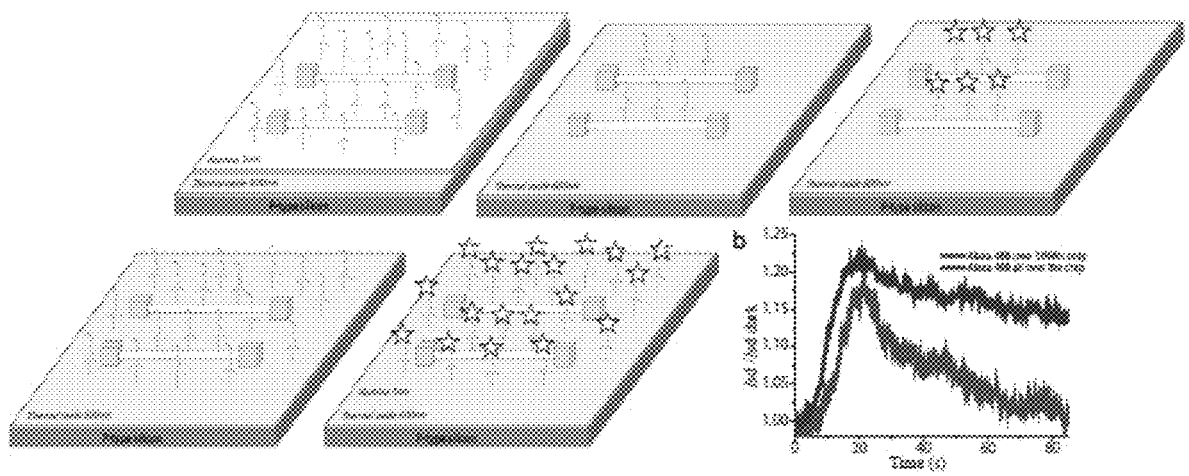
FIG. 12A-i  FIG. 12A-ii  FIG. 12A-iii
FIG. 12A-iv  FIG. 12A-v  FIG. 12B
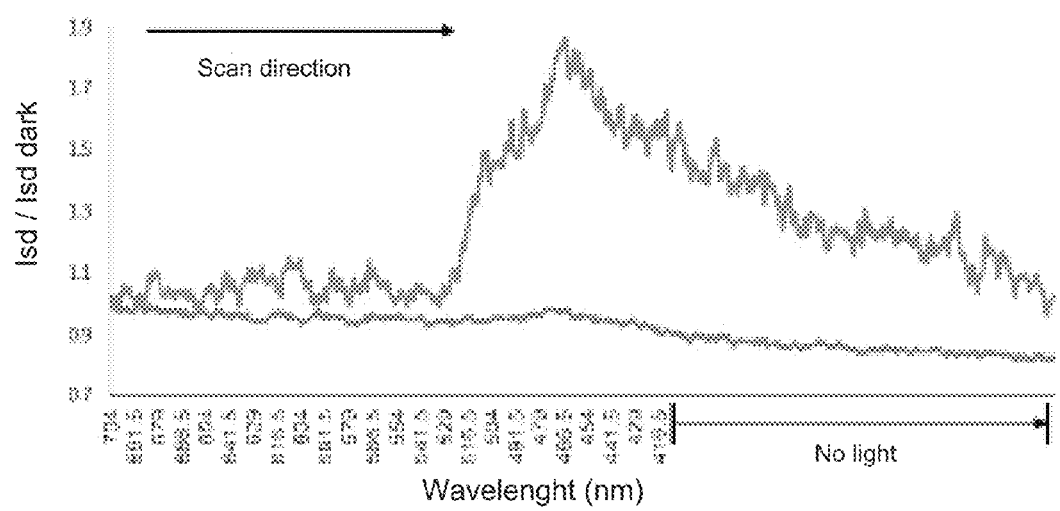
FIG. 13A

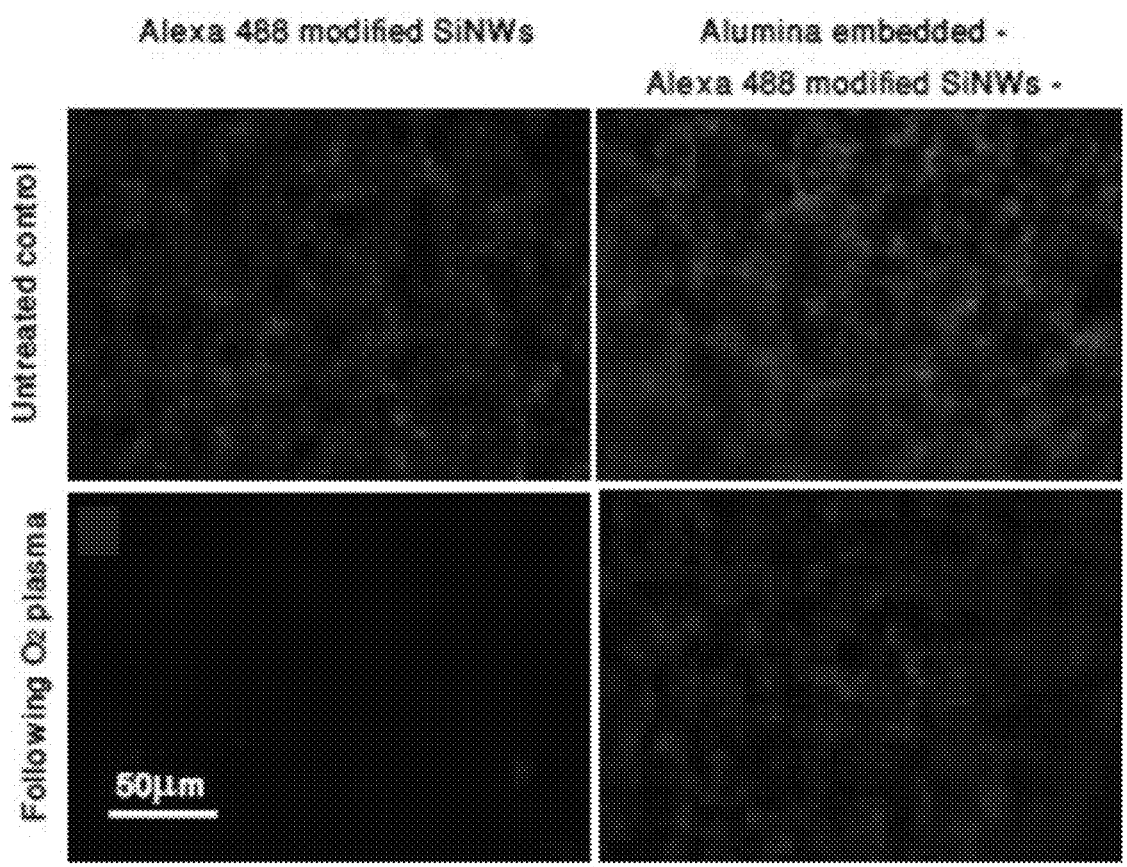

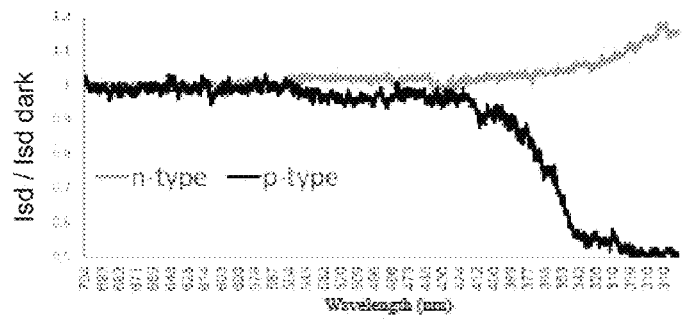
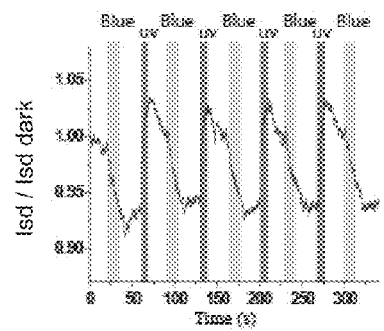
FIG. 19A  FIG. 19B
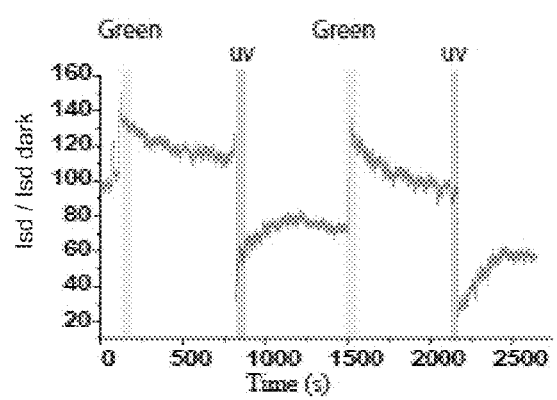
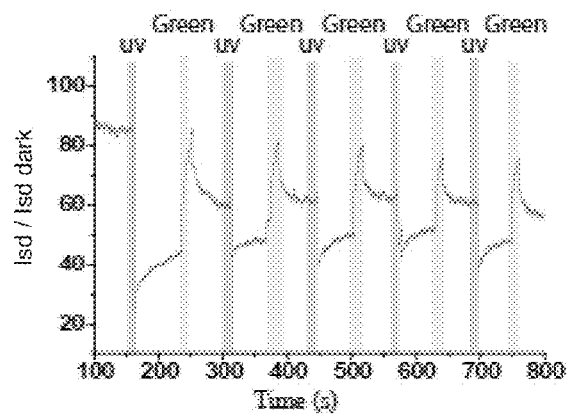
FIG. 20A  FIG. 20B FIG. 21A
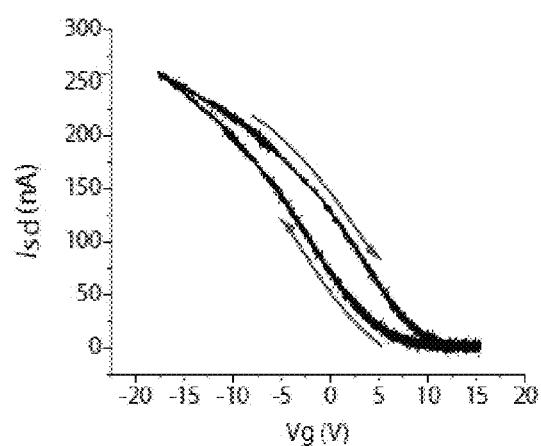
FIG. 21B
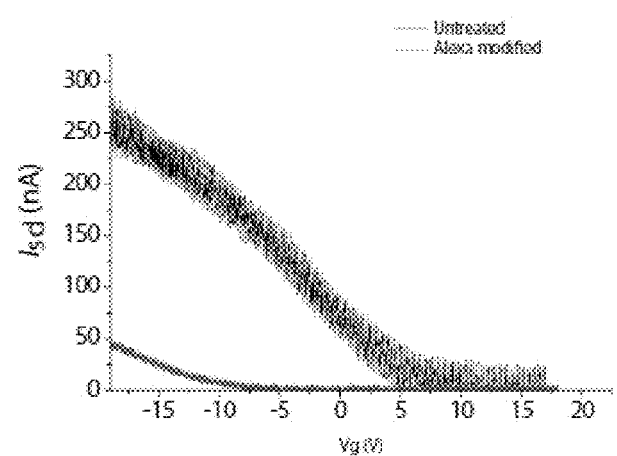
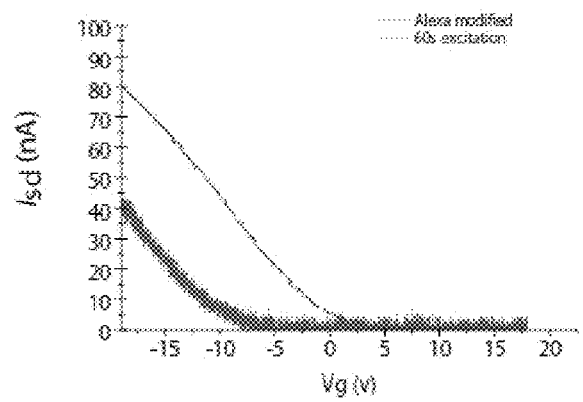
FIG. 21C

SYSTEM AND METHOD FOR SENSING LIGHT

RELATED APPLICATION

This application claims the benefit of priority under 35 USC 119(e) of U.S. Provisional Patent Application No. 62/297,902 filed on Feb. 21, 2016, the contents of which are incorporated herein by reference in their entirety.

FIELD AND BACKGROUND OF THE INVENTION

The present invention, in some embodiments thereof, relates to sensing and, more particularly, but not exclusively, to a system and a method for sensing light.

Photodetectors are used for light sensing in myriad applications and in diverse fields of science and technology. In these sensors, optical signals are transformed into elementary charge carriers, such as electrons, holes or ions. Signal charge packets of such elementary charge carriers are amplified and converted to an electrical signal which is fed into a recording or analyzing device and/or used as a feedback signal for monitoring.

Spectral discrimination by photodetectors is currently realized using broadband inorganic semiconductor photodiodes in combination with a dichroic mirrors or set of optical filters. For narrowband light sensing several approaches have been utilized. In one approach, broadband photodetectors are combined with bandpass filters and nanocrystals in a photodiode active layer [Lim et al., 2015, Scientific Reports 5, 7708; Lee et al., 2014, The Journal of Physical Chemistry C 118, 13424-13431; Lyons et al., 2014, Organic Electronics 15, 2903-2911]. In another approach, the light is split into its component colors [Nishiwaki et al., 2013, Nat Photon 7, 248-254]. In another approach, the plasmonic effect is utilized to enhance absorption in a particular wavelength range [Sobhani et al., 2013, Nat Commun 4, 1643].

For the detection of light in the infrared range at wavelengths above 600 nm, quantum dots in combination with graphene have been utilized [Klekachev et al., 2011, Physica E: Low-dimensional Systems and Nanostructures 43, 1046-1049; Konstantatos et al., 2012, Nat Nano 7, 363-368].

Additional Background Art includes WO2011/154939, the contents of which are hereby incorporated by reference.

SUMMARY OF THE INVENTION

According to an aspect of some embodiments of the present invention there is provided a light sensor. The light sensor comprises a nanostructure connectable to a source electrode and a drain electrode, and light sensitive moiety covalently attached to a surface of the nanostructure, the light sensitive moiety comprises a light sensitive molecule having an absorbance spectrum in a visible range, the light sensitive molecule being selected such that upon irradiation of the light sensor by light having a central wavelength within the absorbance spectrum, the sensitive molecule transfers or extracts an electron to or from the surface of the nanostructure.

According to some embodiments of the invention the light sensor comprises a plurality of nanostructures, wherein at least two of the nanostructures are covalently attached to light sensitive moieties comprises light sensitive molecules having different absorbance spectra.

According to some embodiments of the invention the light sensor has a layered structure, wherein the at least two nanostructures occupy different layers in the layered structure.

According to some embodiments of the invention the nanostructure is inorganic.

According to some embodiments of the invention the nanostructure comprises a semiconductor material.

According to some embodiments of the invention the semiconductor material comprises silicon.

According to some embodiments of the invention the nanostructure is aligned horizontally on a substrate.

According to some embodiments of the invention the nanostructure is suspended horizontally above a substrate.

According to some embodiments of the invention the nanostructure and the attached light sensitive moiety are embedded in a protective layer.

According to some embodiments of the invention the light sensitive molecule is a fluorophore molecule.

According to some embodiments of the invention there is a plurality of light sensitive moieties covalently attached to the surface of the nanostructure, and wherein at least two of the light sensitive moieties comprise light sensitive molecules having different absorbance spectra.

According to an aspect of some embodiments of the present invention there is provided an optical memory, comprises the light sensor as delineated above and optionally and preferably as exemplified below.

According to an aspect of some embodiments of the present invention there is provided an optical switch, comprises the light sensor as delineated above and optionally and preferably as exemplified below.

According to an aspect of some embodiments of the present invention there is provided an artificial retina, comprises the light sensor as delineated above and optionally and preferably as exemplified below.

According to an aspect of some embodiments of the present invention there is provided an optoelectric modulator, comprises the light sensor as delineated above and optionally and preferably as exemplified below.

According to an aspect of some embodiments of the present invention there is provided a multiplexer, comprises the light sensor as delineated above and optionally and preferably as exemplified below.

According to an aspect of some embodiments of the present invention there is provided an imaging system, comprises the light sensor as delineated above and optionally and preferably as exemplified below.

According to an aspect of some embodiments of the present invention there is provided a method of sensing light. The method comprises directing light to a light sensor and measuring current between the electrodes, wherein the light sensor comprises a source electrode, a drain electrode, a nanostructure connected between the electrodes, and a light sensitive moiety covalently attached to a surface of the nanostructure, the light sensitive moiety comprises a light sensitive molecule having an absorbance spectrum in a visible range, the light sensitive molecule being selected such as to transfer or extract an electron to or from the surface of the nanostructure responsively to the light.

According to some embodiments of the invention the light sensor comprises a plurality of nanostructures, wherein at least two of the nanostructures are covalently attached to light sensitive moieties comprises light sensitive molecules having different absorbance spectra.

According to some embodiments of the invention the at least two nanostructures are connected to different source electrodes and/or different drain electrodes.

According to an aspect of some embodiments of the present invention there is provided a method of switching. The method comprises: providing a light sensor having a source electrode, a drain electrode, a nanostructure connected between the electrodes, and a light sensitive moiety covalently attached to a surface of the nanostructure, the light sensitive moiety comprises a light sensitive molecule having an absorbance spectrum in a visible range; directing light having a first central wavelength to the light sensor to effect a change in electrical conductance of the nanostructure; and directing light having a second central wavelength to the nanostructure to reverse the change in the electrical conductance.

According to some embodiments of the invention the first central wavelength is in the visible range and the second central wavelength is in an ultraviolet range.

According to some embodiments of the invention the light sensor comprises a plurality of nanostructures.

According to some embodiments of the invention the light sensor has a layered structure, wherein the at least two nanostructures occupy different layers in the layered structure.

According to some embodiments of the invention the at least two nanostructures engage the same plane.

According to an aspect of some embodiments of the present invention there is provided an optoelectronic system. The system comprises: a semiconductor substrate having a p region and an n region forming a p-n junction therebetween; an insulating layer on the substrate above the p-n junction; and a layer of light sensitive moieties having an absorbance spectrum deposited on the insulating layer, such that the insulating layer is charged responsively to interaction of the light sensitive moieties with light having a central wavelength in the absorbance spectrum.

According to an aspect of some embodiments of the present invention there is provided an optoelectronic system. The system comprises a semiconductor substrate between a first layer of light sensitive moieties comprises light sensitive molecules having a first absorbance spectrum, and a second layer of light sensitive moieties comprises light sensitive molecules having a second absorbance spectrum, the second layer of light sensitive moieties being embedded in or deposited on an inversion layer selected to invert a response of the semiconductor substrate to an interaction of the second layer with light having a central wavelength in the second absorbance spectrum.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions.

Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF SEVERAL VIEWS OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a schematic illustration of a light sensor, according to some embodiments of the present invention.

FIGS. 2A and 2B are schematic illustrations of a light sensor in embodiments of the invention in which the light sensor comprises a plurality of nanostructures.

FIG. 3 is a schematic illustration of an optical memory, according to some embodiments of the present invention.

FIG. 4 is a schematic illustration of an optical switch, according to some embodiments of the present invention.

Figure 5A:
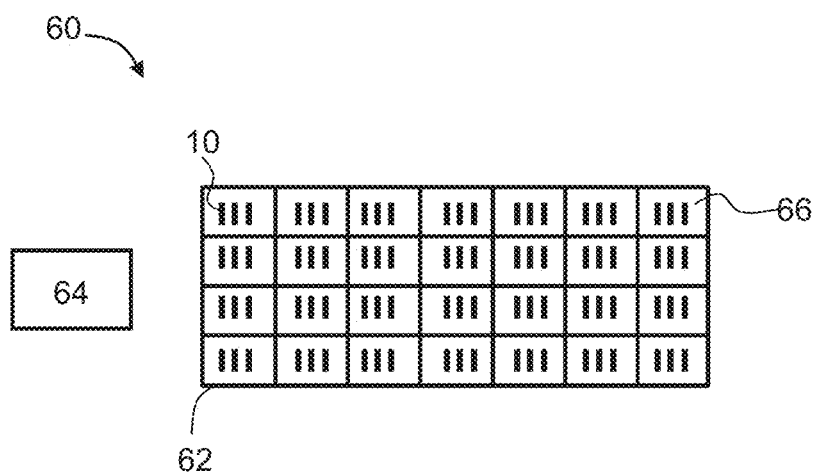
Figure 5B:
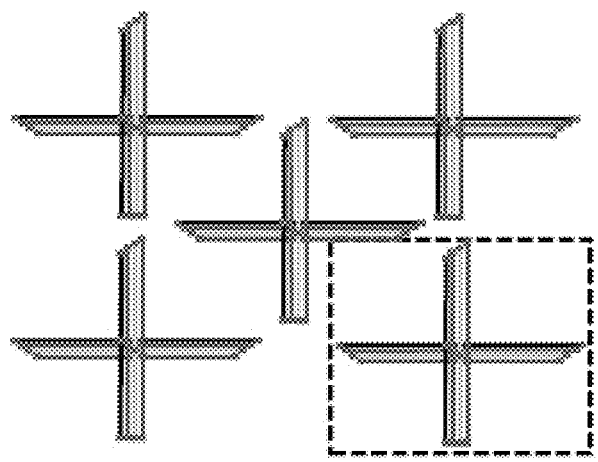
Figure 5C:
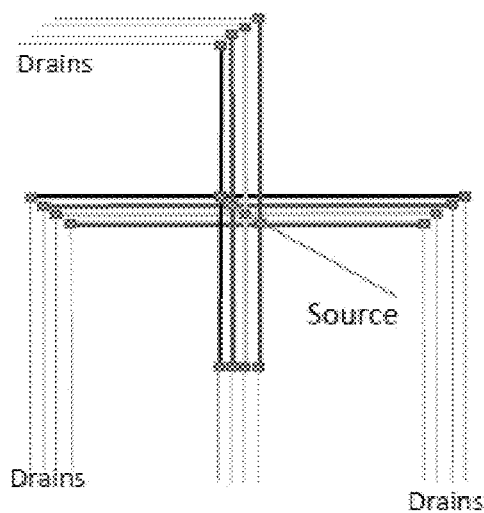

FIGS. 5A-C are schematic illustrations of an imaging system, according to some embodiments of the present invention.

FIGS. 6A-J show the architecture and characteristics of devices fabricated according to some embodiments of the present invention.

FIGS. 7A-E show spectral-specific response of devices fabricated according to some embodiments of the present invention.

FIGS. 8A-H show accumulation and dissipation of negative charges following spectral-specific excitation of devices fabricated according to some embodiments of the present invention.

FIGS. 9A-D show spectra control of ON and OFF states of suspended nonvolatile memory elements, fabricated according to some embodiments of the present invention.

FIGS. 10A-E show results obtained according to some embodiments of the present invention for a single-nanowire dual-pixel nanodetector.

Figure 11A:
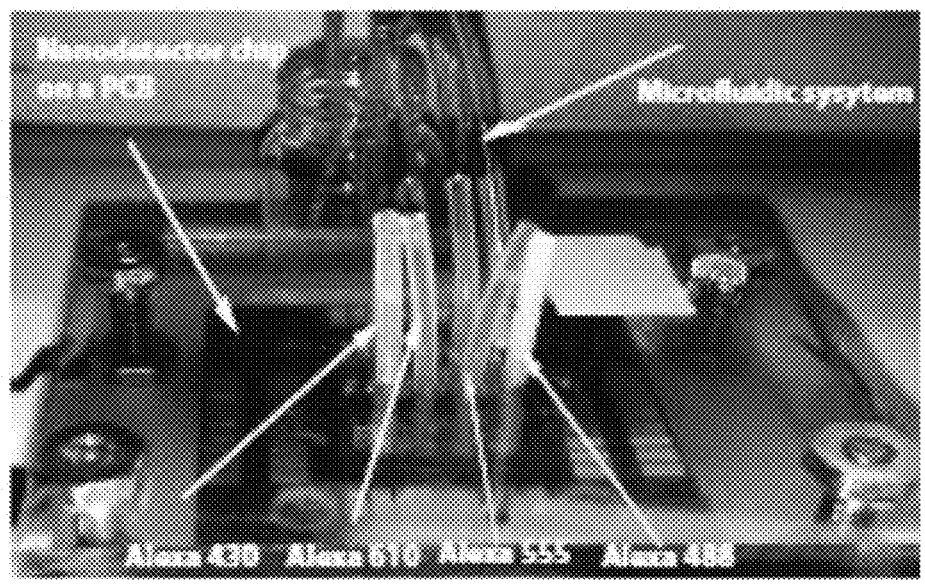
Figure 11B:
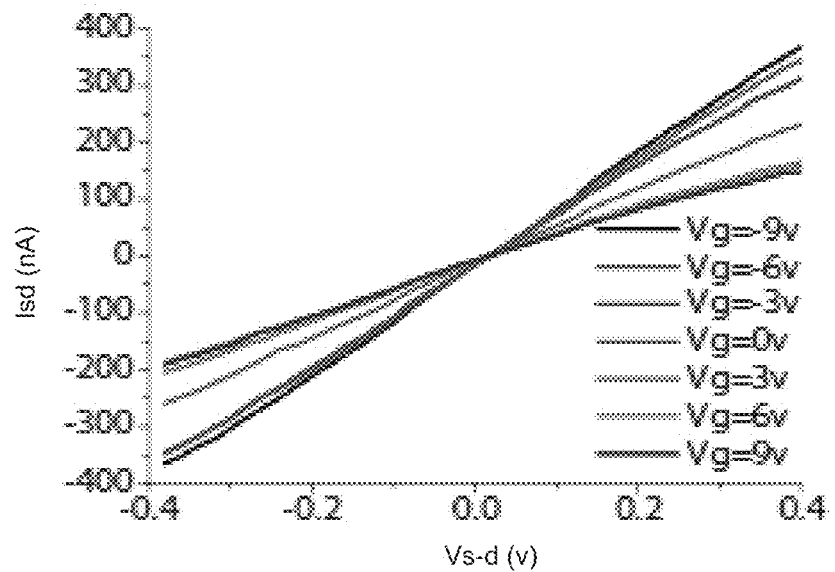

FIGS. 11A-B show results of Alexa-flour modification of sensing chips, fabricated according to some embodiments of the present invention.

FIGS. 12A-i, 12A-ii, 12A-iii, 12A-iv, 12A-v and 12B show schematic illustrations (12A-i, 12A-ii, 12A-iii, 12A-iv, 12A-v) and electrical characterization (FIG. 12B) of SGFETs SiNW-restricted fluorophore modification scheme, according to some embodiments of the present invention.

Figure 13B:
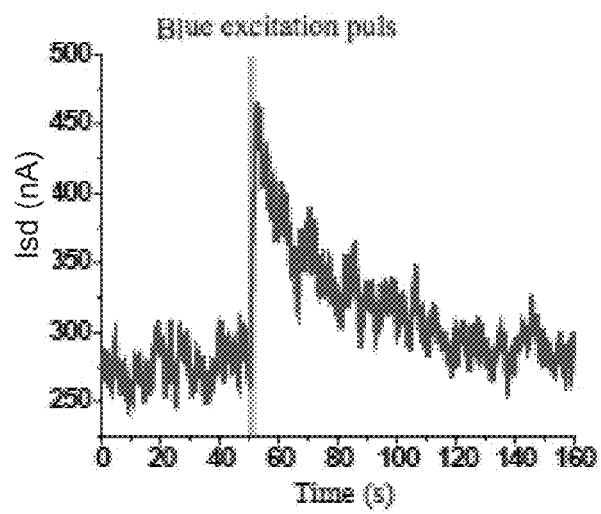
Figure 13C:
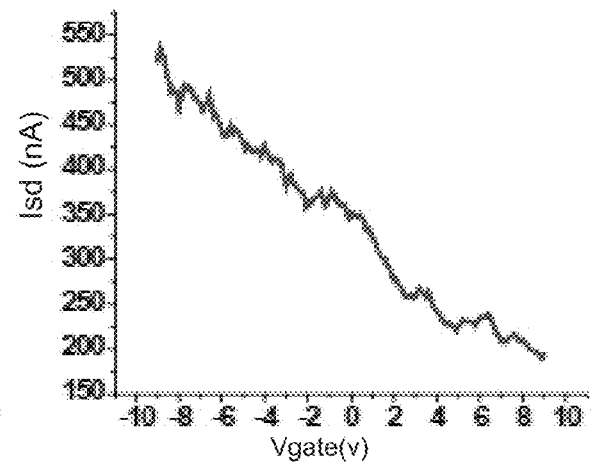

FIGS. 13A-C show sub-micron Blue-SGFET Spectral-Specific Response obtained during experiments performed according to some embodiments of the present invention.

FIGS. 14A-F demonstrate durability of fluorophore modified SiNWs fabricated according to some embodiments of the present invention in an Alumina transparent shell.

Figure 15A:
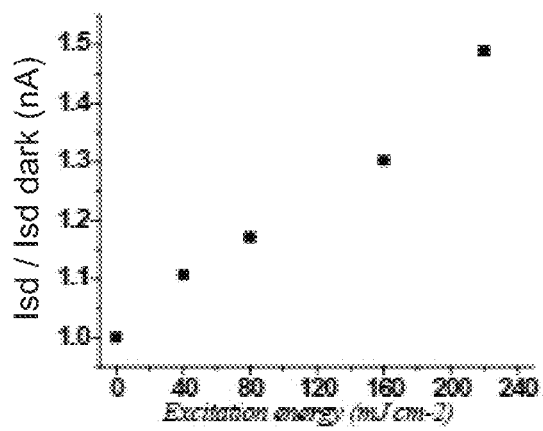
Figure 15B:
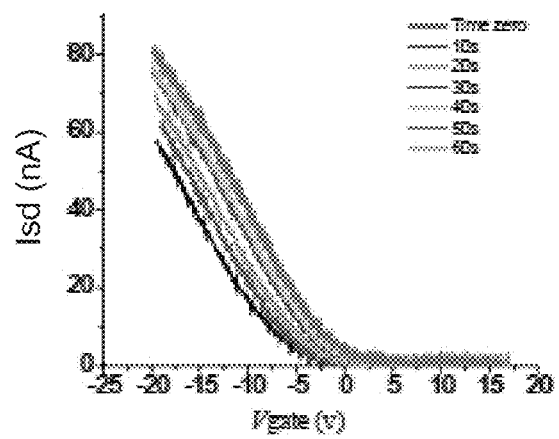
Figure 15C:
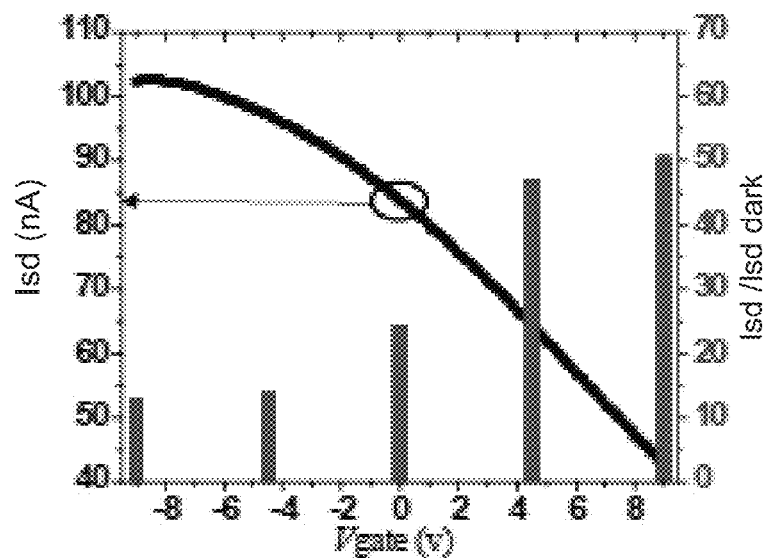

FIGS. 15A-C show results of measurements with a field-effect of SGFETs following spectral-specific excitation obtained during experiments performed according to some embodiments of the present invention.

FIGS. 16A-D show KPFM measurements of spectral specific charge accumulation of fluorophore modified SiNWs, obtained during experiments performed according to some embodiments of the present invention.

Figure 17A:
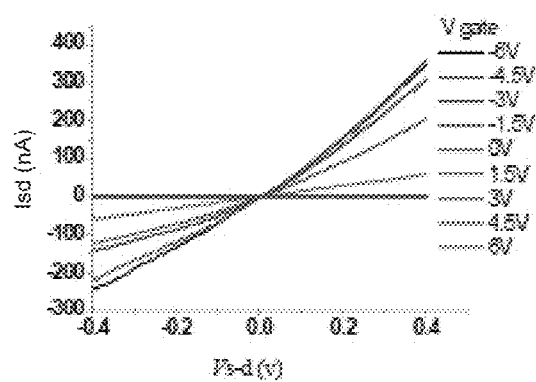
Figure 17B:
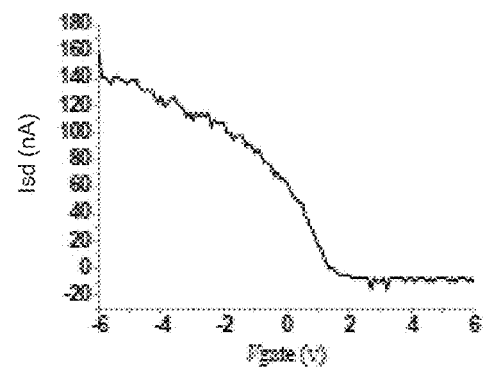

FIGS. 17A and 17B show electrical characteristics of suspended SGFETs, obtained during experiments performed according to some embodiments of the present invention.

Figure 18:
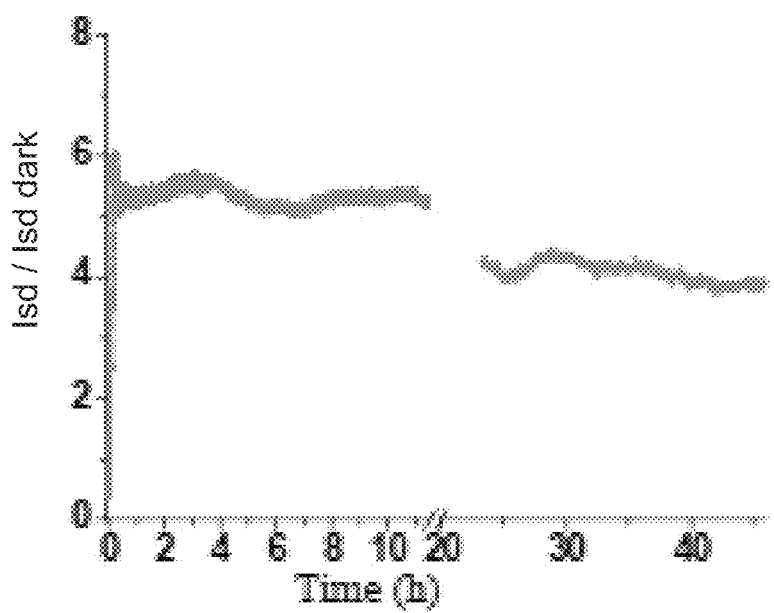

FIG. 18 shows long-term memory effect under ambient conditions of green-SGFETs, obtained during experiments performed according to some embodiments of the present invention.

FIGS. 19A and 19B show results obtained by UV Illumination of the SGFETs, obtained during experiments performed according to some embodiments of the present invention.

FIGS. 20A and 20B demonstrate spectral Control of the ON and OFF State of suspended green-SGFET nonvolatile memory element obtained during experiments performed according to some embodiments of the present invention.

FIGS. 21A-C show results of electrical TC analysis of planar SGFETs, obtained during experiments performed according to some embodiments of the present invention.

Figure 22:
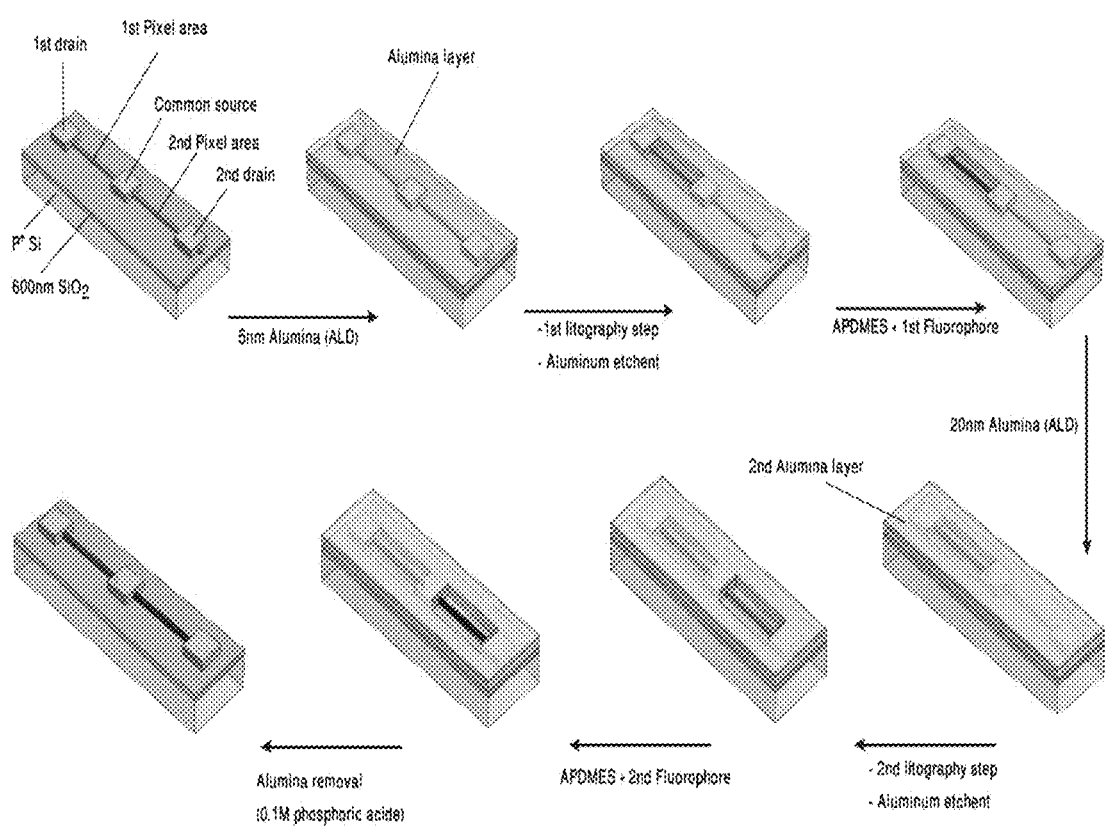

FIG. 22 schematically illustrates fabrication process of a single SiNW for multi-color detection according to some embodiments of the present invention.

Figure 23A:
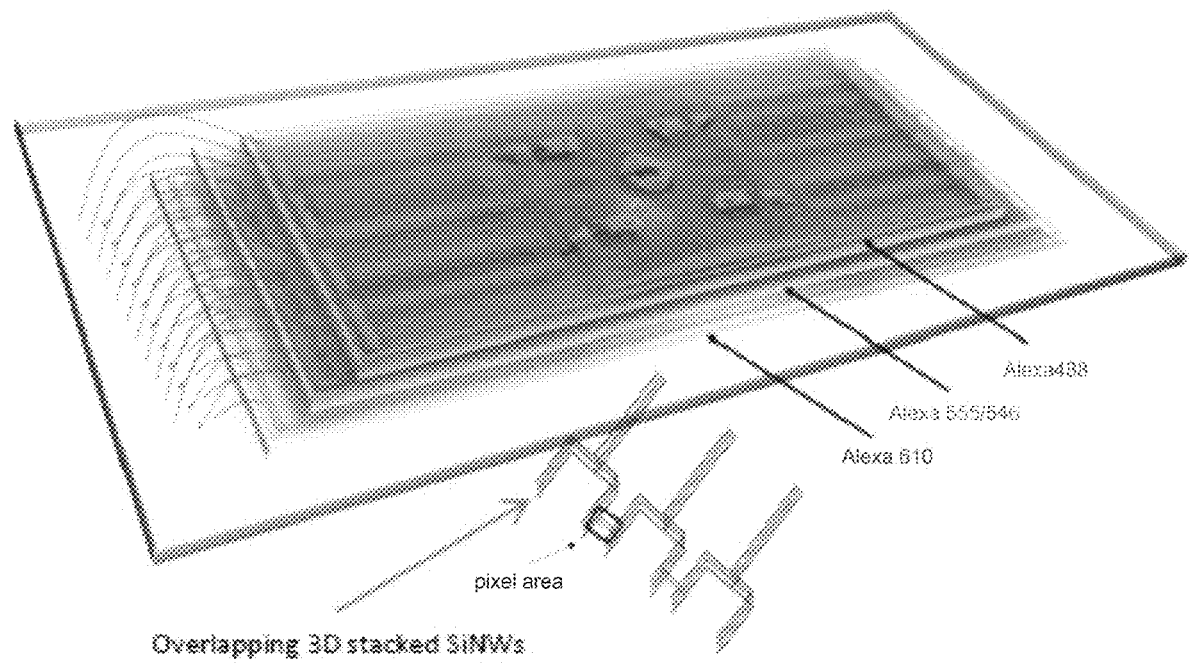
Figure 23B:
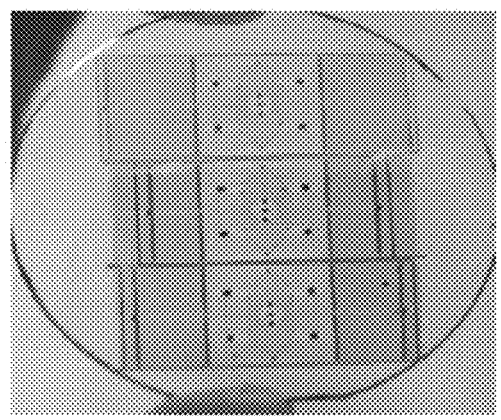

FIGS. 23A and 23B are a schematic illustration (FIG. 23A) and image (FIG. 23B) of a filter-free stacked color detector, according to some embodiments of the present invention.

Figure 24:
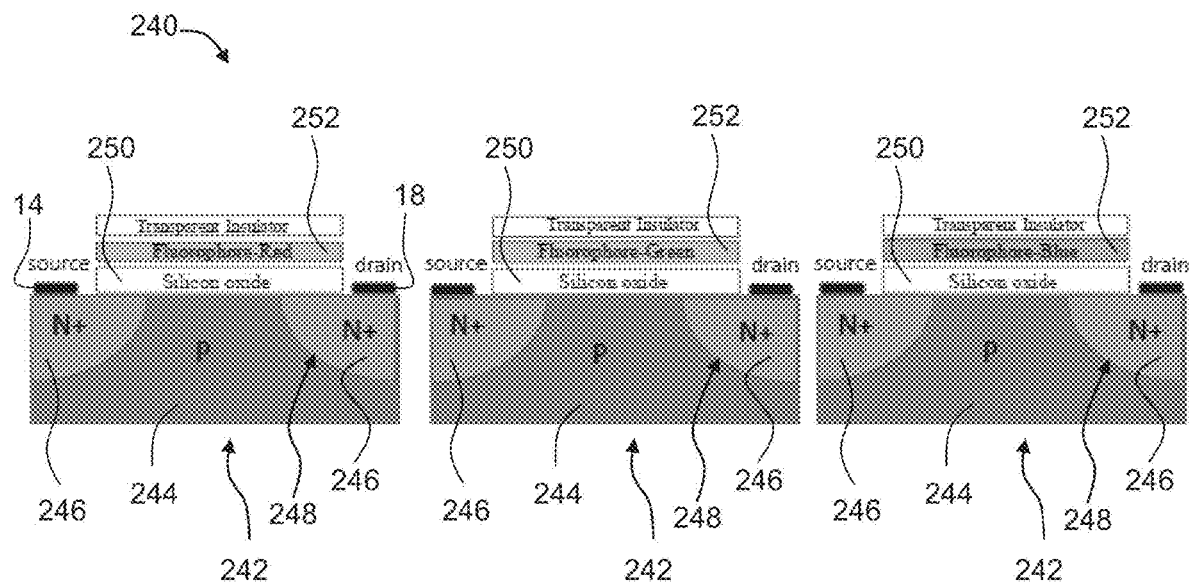

FIG. 24 is a schematic illustration of an optoelectronic system with a semiconductor substrate having a p-n junction, according to some embodiments of the present invention.

Figure 25:
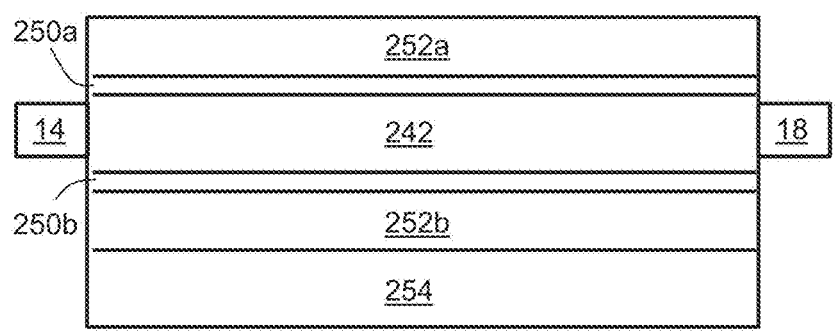

FIG. 25 is a schematic illustration of an optoelectronic system, with a semiconductor substrate between two layers of light sensitive moieties, according to some embodiments of the present invention.

DESCRIPTION OF SPECIFIC EMBODIMENTS OF THE INVENTION

The present invention, in some embodiments thereof, relates to sensing and, more particularly, but not exclusively, to a system and a method for sensing light.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

It was found by the Inventors that spectrally tunable narrowband responses with sufficiently small full width at half-maxima (FWHM) (e.g., less than 500 nm or less than 400 nm or less than 300 nm or less than 200 nm or less than 100 nm) cannot be obtained using conventional approaches. The inventors have therefore devised an optoelectronic system that integrates a light sensitive molecule with a wavelength-specific absorbance with a semiconductor structure, wherein the light sensitive molecule provides the optical selectivity, and the semiconductor structure provides the electronic functionality.

Figure 1:
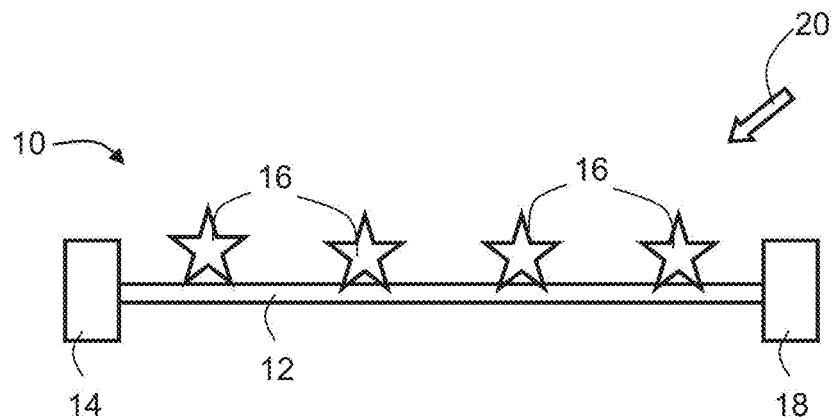

Referring now to the drawings, FIG. 1 illustrates a light sensor 10, according to some embodiments of the present invention. Sensor 10 optionally and preferably comprises a nanostructure 12 connectable to a source electrode 14 and a drain electrode 18, and a light sensitive moiety 16 covalently attached to a surface of nanostructure 12. Light sensitive moiety 16 comprises a light sensitive molecule optionally and preferably having an absorbance spectrum in a visible range, for example, an absorbance spectrum within a range defined from about 400 nm to about 800 nm. In various exemplary embodiments of the invention the absorbance spectrum of each molecule in moiety 16 is characterized by a FWHM of less than 500 nm or less than 400 nm or less than 300 nm or less than 200 nm or less than 100 nm.

It is appreciated that a single nanostructure can be covalently attached to more than one light sensitive moiety. The present disclosure contemplates embodiments in which all the moieties 16 that are attached to the same nanostructure 12 comprise a light sensitive molecule of the same type (and therefore have the same or similar absorbance spectrum). The present disclosure contemplates embodiments in which two or more of the moieties 16 that are attached to the same nanostructure 12 comprise light sensitive molecules of the different types (and therefore have different absorbance spectra). For example, nanostructure 12 can be an elongated nanostructure with a plurality of segments wherein the surfaces of two or more segments are covalently attached to light sensitive moieties comprising light sensitive molecules of different types.

Nanostructure 12 can be aligned horizontally on a substrate (not shown in FIG. 1). Alternatively, nanostructure 12 can be suspended. The latter embodiment is particularly useful when sensor device comprises a plurality of nanostructures, in which case the nanostructures form a suspended network.

Upon interaction of molecule 16 with light 20, an electron transfer occurs between molecule 16 and the surface of nanostructure 12 (for example, molecule 16 can transfer an electron to the surface of nanostructure 12) thereby changing the electron density, hence also the conductance, of nanostructure 12. As a result, nanostructure 12 becomes conductive allowing current to flow between the source 14 and the drain 18.

The charge state of nanostructure 12, or equivalently its conductance can be determined by applying a voltage using a voltage source (not shows) between electrodes 14 and 18 and detecting the source-drain current, wherein the level of the source-drain current for the applied voltage is indicative of the charge state of nanostructure 12.

The wavelength of the light which induces the electron transfer depends on the absorbance spectrum of the light sensitive molecule in moiety 16. Specifically, when the absorbance spectrum has a peak at wavelength of from $\lambda_{min}$ to $\lambda_{max}$ the electron transfer occurs in response to an interaction with light having a central wavelength within the range $[\lambda_{min}, \lambda_{max}]$. The range $[\lambda_{min}, \lambda_{max}]$ can correspond, for example, to red light (e.g., from about 625 nm to about 725 nm), or green light (e.g., from about 500 nm to about 550 nm), or blue light (e.g., from about 450 nm to about 500 nm), or violet light (e.g., from about 400 nm to about 450 nm), etc.

As demonstrated in the examples section that follows, the charging process of nanostructures 12 can optionally and preferably be inverted to restore the electrical state of nanostructures 12, for example, by illuminating sensor 10 by ultraviolet light. Thus, when the wavelength of the incoming light is in the absorbance spectrum of moieties 16, nanostructure 12 assumes an ON state, and when the light is an ultraviolet light nanostructure 12 assumes an OFF state.

As used herein, a "nanostructure" describes an elongated nanoscale semiconductor which, at any point along its length, has at least one cross-sectional dimension and, in some embodiments, two orthogonal cross-sectional dimensions less than 1 micron, or less than 500 nanometers, or less than 200 nanometers, or less than 150 nanometers, or less than 100 nanometers, or even less than 70, less than 50 nanometers, less than 20 nanometers, less than 10 nanometers, or less than 5 nanometers. In some embodiments, the cross-sectional dimension can be less than 2 nanometers or 1 nanometer.

In some embodiments, nanostructure 12 has at least one cross-sectional dimension ranging from 0.5 nanometers to 200 nanometers, or from 1 nm to 100 nm, or from 1 nm to 50 nm.

The length of a nanostructure expresses its elongation extent generally perpendicularly to its cross-section. According to some embodiments of the present invention the length of the nanostructure ranges from 10 nm to 50 microns.

The cross-section of the elongated semiconductor may have any arbitrary shape, including, but not limited to, circular, square, rectangular, elliptical and tubular. Regular and irregular shapes are included.

In various exemplary embodiments of the invention the nanostructure is a non-hollow structure, referred to herein as "nanowire".

A "wire" refers to any material having a conductivity, namely having an ability to pass charge through itself.

In some embodiments, a nanowire has an average diameter that ranges from 0.5 nanometers to 200 nanometers, or from 1 nm to 100 nm, or from 1 nm to 50 nm.

In some embodiments of the present invention, the nanostructure is shaped as hollow tubes, preferably entirely hollow along their longitudinal axis, referred to herein as "nanotube" or as "nanotubular structure".

The nanotubes can be single-walled nanotubes, multi-walled nanotubes or a combination thereof.

In some embodiments, an average inner diameter of a nanotube ranges from 0.5 nanometers to 200 nanometers, or from 1 nm to 100 nm, or from 1 nm to 50 nm. In case of multi-walled nanotubes, in some embodiments, an interwall distance can range from 0.5 nanometers to 200 nanometers, or from 1 nm to 100 nm, or from 1 nm to 50 nm.

Exemplary nanotubes and methods of preparing same are disclosed in WO 2010/052704, which is incorporated by reference as if fully set forth herein.

Selection of suitable semiconductor materials for forming a nanostructure as described herein will be apparent and readily reproducible by those of ordinary skill in the art, in view of the guidelines provided herein for beneficially practicing embodiments of the invention.

Nanostructure 12 can be made from a material selected from one or more of a semiconductor, a metal and a nonmetal. For example, semiconductor materials include, but are not limited to, an elemental semiconductor of Group IV and various combinations of two or more elements from any of Groups III, IV, V and VI of the periodic table of the elements.

As used herein, the term "group" is given its usual definition as understood by one of ordinary skill in the art. For instance, group III elements include B, Al, Ga, In and Tl; Group IV elements include C, Si, Ge, Sn and Pb; Group V elements include N, P, As, Sb and Bi; and Group VI elements include 0, S, Se, Te and Po.

Also contemplated is any metal material including, but not limited to, aluminum (Al) and gallium (Ga), or any nonmetal material including, but not limited to, carbon (C), or combinations of metals and nonmetals, from the respective groups of elements from the periodic table. For example and not by way of limitation, silicon (Si), germanium (Ge), silicon carbide (SiC), gallium arsenide (GaAs), gallium indium arsenide (GaInAs) and zinc oxide (ZnO), are a few non-limitative examples of the materials that are useful as a nanostructure material according to some embodiments of the present invention.

Nanostructure 12 can also be fullerene carbon nanotubes, either single-walled nanotubes (SWNT), which are can be considered as long wrapped graphene sheets, or multi walled nanotubes (MWNT) which can be considered as a collection of concentric SWNTs with different diameters. A typical diameter of a SWNT is less of the order of a few nanometers and a typical diameter of a MWNT is of the order of a few tens to several hundreds of nanometers.

Nanostructure 12 can be elongated heterostructures of nanometric size, e.g., nanowire heterostructures or nanotube hetero structures.

The term "heterostructure" as used herein refers to a structure in which materials having different compositions meet at interfaces. The different compositions forming a heterostructure can be different materials and/or different doping levels or types. An "elongated heterostructure of nanometric size" means a heterostructures having the dimensions of a nanostructure as defined above.

The different compositions can be distributed along the longitudinal direction of the elongated heterostructure, in which case the heterostructure is referred to as "axial heterostructure", or they can be distributed along the radial direction (e.g., forming a core with one or more shells), in which case the heterostructure is referred to as a "radial heterostructure." Both axial and radial heterostructures are contemplated in various embodiments of the invention.

An interface between two different compositions in a heterostructure can form a p-n junction, when the composition on one side of the interface includes a p-doping and the other the composition on the other side of the interface includes a n-doping. In embodiments in which the heterostructure includes more than one p-n junction along its longitudinal dimension, it essentially comprises segments along its lengths that are different. For example, a heterostructure can have alternating portions that are differently doped and/or are made from different materials. For example, an elongated heterostructure can include a first heavily p-doped silicon segment, a second heavily n-doped GaN segment, and a third heavily n-doped silicon segment. Any other combination of doping and materials in an elongated heterostructure can be used. The length of the doped segments of an elongated hetero structure may or may not be uniform.

Herein, a "light sensitive molecule" is also referred to herein interchangeably as "light sensitive group" describes a molecule, or a portion thereof (e.g., a portion of a molecule that remains after the molecule is covalently attached to the nanostructure, directly or via a linker, as described herein) which, upon interaction with light, a change in its electronic structure occurs. This phrase, as used herein, refers to molecules or groups derived from light sensitive compounds.

In any embodiment of the invention, the light sensitive molecule is preferably a molecule that absorbs a photon and as a result a change in the energy level of one or more electrons occurs, whereby as a result of this change in energy level, the molecule transfers to, or receives from, the nanostructure an electron. Any light sensitive groups, including groups derived from commercially available, and synthetically prepared or modified compounds, are suitable for use in the context of the present embodiments.

In some embodiments, the light sensitive molecule or moiety transfers an electron to the nanostructure as a result of light absorbance.

In some embodiments, the light sensitive molecule or moiety is derived from a light sensitive compound which is non-conductive.

A representative example of a suitable light sensitive molecule is a fluorophore molecule, e.g., a fluorescent molecule or group derived from a fluorescent compound.

The advantage of using fluorophore molecule is that following spectral-specific absorbance of fluorophores, the electron in the ground HOMO state is excited to a higher energy LUMO state, where they normally relax back to the ground state by emitting fluorescent light. Occasionally, the molecule visits a triplet state, at which the molecule can transfer an electron to its surroundings, where the frequency of occurrences of the triplet states depends on proximate surface interaction. Following the electron transfer, the fluorophore enters an OFF state until it regains back of an electron. This effect enable the fluorophore molecule to transfer an electron to the surface of the nanostructures effecting a change in the conductivity of the nanostructure.

Examples of fluorescent compounds include, but are not limited to, Xanthenes, such as, but not limited to, fluorescein, rhodamine, Oregon green, eosin, Texas red etc.; Cyanine (Cy) dyes such as, but not limited to, cyanine, indocarbocyanine, oxacarbocyanine, thiacarbocyanine and merocyanine; Naphthalenes, such as, but not limited to, dansyl and prodan derivatives; Coumarins such as, but not limited to, hydroxycoumarin, methoxycoumarin, aminocoumarin; oxadiazoles such as, but not limited to, pyridyloxazole, nitrobenzoxadiazole and benzoxadiazole; Squaraine derivatives and ring-substituted squaraines, such as, but not limited to, Seta, SeTau, and Square dyes; Pyrenes such as cascade blue; Oxazines such as, but not limited to, Nile red, Nile blue, cresyl violet, oxazine 170 etc.; Acridines such as, but not limited to, proflavin, acridine orange, acridine yellow; and Arylmethines such as, but not limited to, auramine, crystal violet, malachite green.

Additional examples of fluorescent compounds are categorized by their brand names and include, without limitation, CF dye (Biotium); Alexa Fluor dyes (Invitrogen); Atto and Tracy dyes (Sigma Aldrich); FluoProbes (Interchim); and others.

Additional non-limiting examples of fluorescent compounds suitable for some embodiments of the invention include: Hydroxycoumarin; Aminocoumarin; Methoxycoumarin; Cascade Blue; Pacific Blue; Pacific Orange; Lucifer yellow; NBD; R-Phycoerythrin (PE); PE-Cy5 conjugates; PE-Cy7 conjugates; Red 613; PerCP; TruRed; FluorX; Fluorescein; BODIPY-FL; TRITC; X-Rhodamine; Lissamine Rhodamine B; Texas Red; Aliaphycocyanin; APC-Cy7 conjugates and Cy Dyes including, for example, Cyt, Cy3, Cy3B, Cy3.5, Cy5, Cy5.5 and Cy7.

In some embodiments, the fluorescent compound from which a light sensitive group or moiety is derived is a xanthene.

In some embodiments, the fluorescent compound from which a light sensitive group or moiety is derived is an Alexa Fluor dye, or structurally related compounds.

Alexa Fluor dyes is a family of fluorescent compounds that are prepared by sulfonation of fluorescent compounds such as xanthenes, rhodamines, coumarins and cyanine dyes.

Alexa Fluor dyes include: Alexa Fluor 350 (blue), Alexa Fluor 405 (violet), Alexa Fluor 430 (green), Alexa Fluor 488 (cyan green), Alexa Fluor 500 (green), Alexa Fluor 514 (green), Alexa Fluor 532 (green), Alexa Fluor 546 (yellow), Alexa Fluor 555 (yellow-green), Alexa Fluor 568 (orange), Alexa Fluor 594 (orange-red), Alexa Fluor 610 (red), Alexa Fluor 633 (far-red), Alexa Fluor 635 (far-red), Alexa Fluor 647 (far-red), Alexa Fluor 660 (near-IR), Alexa Fluor 680 (near-IR), Alexa Fluor 700 (near-IR), Alexa Fluor 750 (near-IR), and Alexa Fluor 790 (near-IR).

In some embodiments, the Alexa Fluor dye is a compound prepared by sulfonation of a xanthene.

Additional fluorescent compounds encompass fluorescent proteins, including, without limitation, Y66H, Y66F, EBFP, EBFP2, Azurite, GFPuv, T-Sapphire, Cerulean, mCFP, ECFP, CyPet, Y66 W, mKeima-Red, TagCFP, AmCyan1, mTFP1, S65A, Midoriishi Cyan, Wild Type GFP, S65C, TurboGFP, TagGFP, S65L, Emerald, S65T (Invitrogen), EGFP (Ciontech), Azami Green (MBL), ZsGreenl (Clontech), TagYFP (Evrogen), EYFP (Clontech), Topaz, Venus, mCitrine, YPet, Turbo YFP, ZsYellow1 (Clontech), Kusabira Orange (MBL), mOrange, mKO, TurboRFP (Evrogen), tdTomato, TagRFP (Evrogen), DsRed (Clontech), DsRed2 (Clontech), mStrawberry, TurboFP602 (Evrogen), AsRed2 (Clontech), mRFP1, J-Red, mCherry, HcRedl (Clontech), Katusha, Kate (Evrogen), TurboFP635 (Evrogen), mP!um, and mRaspberry.

The light sensitive moiety comprises or consists of a light sensitive molecule or group.

In some embodiments, the light sensitive moiety comprises a light sensitive group and linker which links it to the nanostructure surface.

In some of any of the embodiments described herein, the light sensitive molecule is covalently attached to the nanostructure's surface by means of covalent bonds formed between reactive groups within the light sensitive molecule and compatible reactive groups on the surface of the nanostructures, directly or via a linker.

Reactive groups on the nanostructure's surface are either intrinsic or can be generated upon a suitable treatment. In some embodiments, where the nanostructure is SiNW or silicon nanotubes, free hydroxyl groups are intrinsically present on the surface of the nanostructures and can be utilized for attaching light sensitive molecules thereto, via covalent bonds formed between the hydroxyl groups and chemically compatible groups in the light sensitive molecule.

Alternatively, the nanostructures described herein are first surface-modified so as to generate surface reactive groups.

Such a surface modification can be performed by, for example, attaching to intrinsic functional groups on the nanostructure surface a bifunctional linker molecule, which comprises in one terminus thereof a reactive group that is capable of forming a bond with these intrinsic functional groups and in another terminus thereof a reactive group that can form a bond with chemically compatible reactive groups of the light sensitive molecule or light sensitive moiety as described herein.

In some of any of the embodiments described herein, the light sensitive moiety comprises, prior to being attached to the nanostructure, a reactive group that can readily react with a reactive group on the nanostructure surface, as described herein, so as to form a covalent bond with the nanostructure surface.

Selecting reactive groups that are compatible with reactive groups on the nanostructure of choice is within the capabilities of any person skilled in the art, particularly in view of the guidance provided herein.

In some embodiments, when the nanostructure is SiNW or silicon nanotubes, the light sensitive moiety comprises a reactive group capable of forming covalent bond with free hydroxy groups on the nanostructure surface. Exemplary such reactive groups include, but are not limited to, halides and alkoxides, which can act as leaving groups so as to form an ether bond, carboxylic acids or esters, which can form an ester bond via esterification or trans esterfication, as well as halosilanes and orthosilicates, which can form —Si—O— bonds.

According to some embodiments of the invention, a light sensitive molecule features such reactive groups and is attached to the nanostructure directly via any one of the bonds described herein.

In some embodiments, the light sensitive molecule is attached to the nanostructure via a bifunctional linker, as described herein.

An exemplary such a linker is derived from an orthosilicate that comprises 1, 2 or 3-OR groups attached to Si, for forming —Si—O—Si bonds with intrinsic hydroxyl groups on the silicon nanostructure surface, and 1, 2 or 3 hydrocarbon groups (e.g., alkyl, alkylene, cycloalkyl, aryl) terminating with a reactive group that is capable of reacting with a reactive group of the light sensitive molecule as described herein, such that the total number of groups attached to the Si atom is 4.

In exemplary embodiments, the linker is an orthosilicate comprising an aminoalkyl, one or more alkyl groups and/or one or more alkoxy groups attached to the Si atom. In one example, the linker is derived from (3-aminoalkyl)-orthosilicatedimethyl-ethoxysilane (APDMES). Such linkers generate a reactive amine group on the surface of the nanostructure. Similar orthosilicate terminating with other reactive groups are also contemplated.

As discussed hereinabove, the light sensitive molecule can be attached to the nanostructure by means of a reactive group that is compatible with a reactive group on the nanostructure surface.

In some embodiments, the light sensitive molecule feature such a reactive group and is attached to the nanostructure's surface by a covalent bond formed between this reactive group and a reactive group generated by means of a bifunctional linker attached to the nanostructure's surface, as described herein.

In some embodiments, the light sensitive molecule is modified so as to feature a reactive group that is chemically compatible with reactive groups on the nanostructure's surface (or of a bifunctional linker as described herein).

For example, when a linker terminating with amine reactive group is attached to the nanostructure's surface, a reactive group that is chemically compatible with amine is generated on the light sensitive molecule, directly or by attaching to the molecule a linker terminating by the reactive group, and the light sensitive molecule is covalently attached to the nanostrucure's surface by means of a covalent bond formed between the reactive groups.

In such embodiments, a linker linking the light sensitive molecule and the nanostructure's surface comprises a bifunctional linker attached to the nanostrucure's surface as described herein, and a linker attached to the light sensitive molecule.

In some embodiments, the light sensitive moiety can be represented by:

-[Y-(L$_1$)$n$-(X)$m$-(L$_2$)$k$-Q]

wherein:

Q is a light sensitive molecule or group, as described herein;

n, m and k are each independently 0 or 1, whereas when n is 0, m is also 0;

Y represents a bond formed between a reactive group intrinsically present on the nanostructure's surface and a chemically compatible reactive group (of a bifunctional linker L1 as described herein, if n is 1; of a linker attached to the light sensitive molecule, if n is 0 and k is 1; or of the light sensitive molecule, if n, m and k are each 0);

$L_1$ and $L_2$ are a first and a second linking group, respectively; and

X represents a bond formed between reactive groups of $L_1$ and $L_2$ (when n and k are each 1) or between $L_1$ and Q (when k is 0).

The first and second linking groups can each independently be a hydrocarbon, as defined herein.

The nature of X and Y is determined by the reactive groups forming the bond.

Representative examples of reactive groups include, without limitation, amine, halide, acyl-halide, sulfonate, sulfoxides, phosphate, hydroxy, alkoxy, aryloxy, thiohydroxy, thioalkoxy, thioaryloxy, cyano, nitro, azo, isocyanate, sulfonamide, C-carboxylate, O-carboxylate, N-thiocarbamate, O-thiocarbamate, urea, thiourea, O-carbamate, N-carbamate, C-amide, N-amide, guanyl, guanidine and hydrazine, as these terms are defined hereinabove.

Those skilled in the art can readily determine reactive groups that are chemically compatible and the bonds formed therebetween.

In some embodiments, Y is O, k is 0 such that L2 is absent, L1 is present (n=1) and is an alkyl, and X is amide, formed between an amine reactive group generated by attached to intrinsic reactive hydroxy group on the nanostructure's surface a bifunctional linker terminating with amine and a carboxy group of the light sensitive molecule.

In some embodiments, L1 and/or L2 is an alkyl and in some embodiments it is short (low) alkyl, of 1-6, or 1-4 carbon atoms in length. In some embodiments, L1, X and L2 form together a moiety that is no more than 20, or no more than 15, or no more than 12 or no more than 10 atoms in length.

For example, silicon nanostructures can be chemically modified by reaction with e.g., aminoalkyltrialkoxysilane, and a fluorophore can be attached via the generated surface amine groups, by forming an amide group with a carboxy group of the fluorophore. Other functional groups and/or modifications are contemplated and are recognized by those skilled in the art.

Figure 2A:
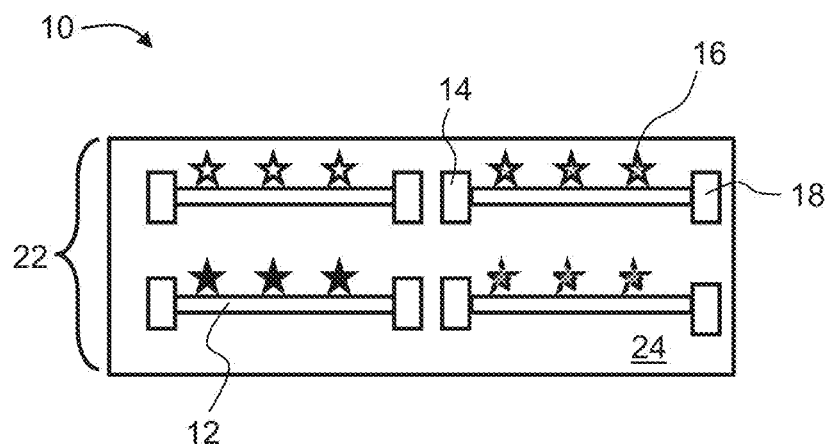
Figure 2B:
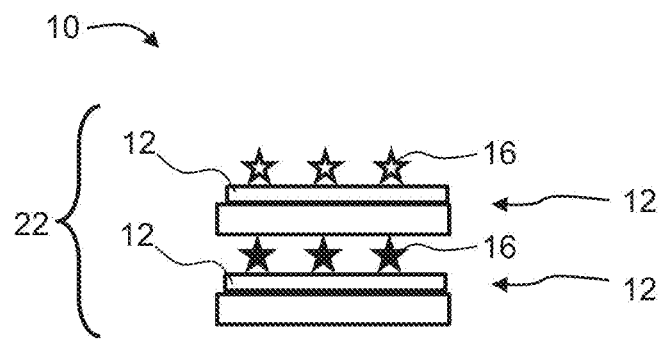

FIGS. 2A and 2B are schematic illustrations of light sensor 10 in embodiments of the invention in which light sensor 10 comprises a plurality of nanostructures. In these embodiments two or more of the nanostructures are optionally and preferably covalently attached to light sensitive moieties 16 having different absorbance spectra. For example, one nanostructure can be covalently attached to a molecule having absorbance spectrum which is predominantly red, one nanostructure can be covalently attached to a molecule having absorbance spectrum which is predominantly green and one nanostructure can be covalently attached to a molecule having absorbance spectrum which is predominantly blue. Such a triplet of nanostructures can be alighted to form an RGB pixel.

More or less than three types of molecules are also contemplated. For example, in addition to, or as a substitution to one or two of, the predominantly red, the predominantly green, and the predominantly blue absorbance spectra, sensor 10 can include a nanostructure that is covalently attached to a molecule having absorbance spectrum which is predominantly violet. Thus, for example, sensor 10 can include one or more quartets of nanostructure where in each quartet each nanostructure is covalently attached to a molecule having absorbance spectrum which is predominantly red, green, blue or violet. Such a quartet of nanostructures can be alighted to form an RGBV pixel.

Other combinations of nanostructures and molecules are also contemplated. For example, one or more of the nanostructures can be covalently attached to two or more light sensitive moieties comprising light sensitive molecules of different types. As a representative example, the nanostructures can be covalently attached to more molecules with predominantly green absorbance spectrum, than to molecules with predominantly red and blue absorbance spectra. Preferably the amount of molecules with predominantly green absorbance spectrum is approximately twice each of the amounts of molecules with predominantly red and blue spectra. This can provide a spectral response that resembles the cones of the human visual system. The nanostructures in these embodiments can be arranged such that the green information is distributed on a quincunx grid and the red and the blue information is distributed on a rectangular grid.

The nanostructures can all engage on the same plane, for example, on a substrate 24, e.g., a planar substrate, as illustrated in FIG. 2A, or sensor 10 can comprise a stack of two or more layers 22, in which case at least two nanostructures occupy different layers, as illustrated in FIG. 2B. Two or more of the nanostructures 12 can be connected to different source electrodes 14 and/or different drain electrodes 18. For clarity of presentation, the source 14 and drain 18 electrodes are not illustrated in FIG. 2B.

Sensor 10 can be used in diverse applications.

Figure 3:
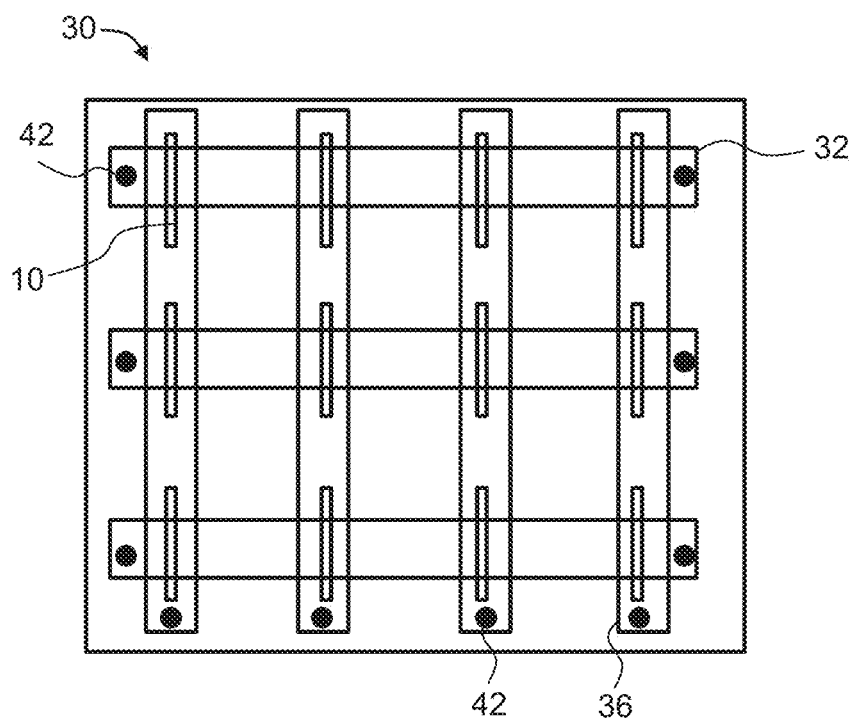

For example, in some embodiments sensor 10 is used as an optical memory, as illustrated in FIG. 3. Shown is an optical memory system 30 which comprises an array of sensors, wherein at least a few, or more preferably all the sensors are sensor 10 as further detailed hereinabove. The sensors are arranged on bit lines 32. Word lines 36 are arranged perpendicular to bit lines 32 such that the intersect region between a word line and a bit defines a memory cell, which in the present illustration comprises a single sensor, but may include more than one sensors for storing more than one bit of information.

A contact region 42 is formed near the end of each word line, and optionally and preferably at both ends of each bit line. The write operation can be achieved by illuminating the respective sensor by light having a central wavelength within the absorbance spectrum of the respective molecule. The sensors along a bit line can thus form a NAND string. An erase operation can be achieved by inverting the effect of the illumination, for example, using ultraviolet light, as demonstrated in the Examples section below. The read operation can be executed by selecting the voltages applied between the source and drain electrodes such that the sensor conducts current if and only if a charge is stored thereon.

Figure 4:
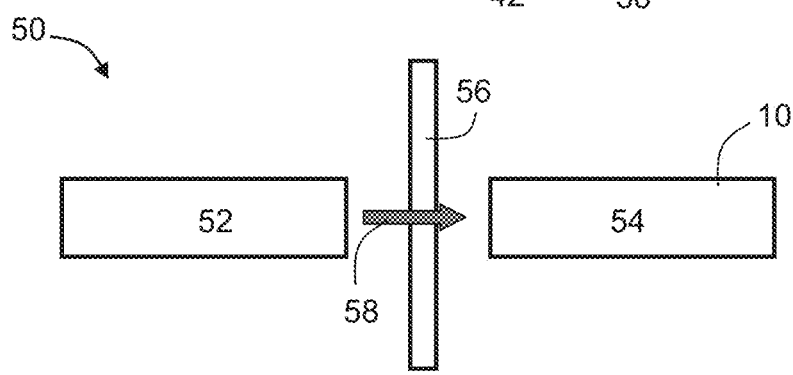

In some embodiments sensor 10 is used as an optical switch, as illustrated in FIG. 4. Shown is an optical switch 50 which comprises an optical transmitter 52 and an optical receiver 54. Transmitter 52 can be any light source, such as, but not limited to, a light emitting diode (LED). Receiver 54 preferably comprises sensor 10. Transmitter 52 is selected such that the radiation emitted thereby is has a central wavelength within the absorbance spectrum of the respective molecule. Transmitter 52 and receiver 54 are kept at optical communication but electrically decoupled. For example, transmitter 52 and receiver 54 can be separated by a transparent barrier 56 which allows the passage of light but prevents any electrical current flow thereacross. Transmitter 52 and receiver 54 preferably oppose each other such that the radiation emitted from transmitter 52 strikes receiver 54. Triggered by an electrical signal, transmitter 52 emits light 58 which passes through barrier 56 and strikes receiver 54. In response, the conductance of receiver 54 is changed and can be tapped off via suitable electronic circuitry to effect switching as known in the art.

In some embodiments sensor 10 is used as an imaging system, as illustrated in FIG. 5A. Shown is an imaging system 60 having an imager 62 and a signal processor 64. Imager 62 comprises a plurality of pixel arrears 66, at least some of the pixel areas, more preferably all the pixel areas are occupied by one or more light sensors, such as, but not limited to, sensor 10. The sensors in each pixel area are optionally and preferably selected to generate separate signals for different spectra arriving thereat. For example, a pixel area can include a sensor that forms an RGB or RGBV pixel as further detailed hereinabove. Signal processor 64 receives the signals from imager 62 and process them to provide a digital image as further detailed hereinabove. In various exemplary embodiments of the invention system 60 is devoid of color filter that is superimposed on imager 62.

A representative example of pixel configuration for imager 62 is illustrated in FIGS. 5B and 5C, where FIG. 5C is a magnified illustration of a pixel surrounded by a dotted line in FIG. 5B. In this example, which is not to be considered as limiting, the nanostructures are crossed, for example, at a right angle with respect to each other, where the source electrode or drain electrode (the source electrode in this example) is shared among the nanostructures. Other pixel configurations are also contemplated, see, for example, FIG. 10A in the Examples section that follows, in which each nanostructure is covalently attached to more than one type of light sensitive moiety.

Additional applications that can incorporate sensor 10 include, without limitation, an artificial retina, which can comprises a network of nanostructures each covalently attached to one or more light sensitive moieties; an optoelectronic demodulator which receives a frequency-modulated optical signal and convert the signal to electricals signals based on the frequency of the signals; and a multiplexer which comprises a plurality of sensors such as sensor 10 and an electronic circuit, where the sensors detect optical signals and generate in response electrical signals, and the circuit combines the electrical signals.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

Herein throughout, the phrase "linking moiety" or "linking group" or "linker" describes a group that connects two or more moieties or groups in a compound. A linking moiety is typically derived from a bi- or tri-functional compound, and can be regarded as a bi- or tri-radical moiety, which is connected to two or three other moieties, via two or three atoms thereof, respectively.

Exemplary linking moieties include a hydrocarbon moiety or chain, optionally interrupted by one or more heteroatoms, as defined herein, and/or any of the chemical groups listed below, when defined as linking groups.

When a chemical group is referred to herein as "end group" it is to be interpreted as a substituent, which is connected to another group via one atom thereof.

Herein throughout, the term "hydrocarbon" collectively describes a chemical group composed mainly of carbon and hydrogen atoms. A hydrocarbon can be comprised of alkyl, alkene, alkyne, aryl, and/or cycloalkyl, each can be substituted or unsubstituted, and can be interrupted by one or more heteroatoms. The number of carbon atoms can range from 2 to 20, and is preferably lower, e.g., from 1 to 10, or from 1 to 6, or from 1 to 4. A hydrocarbon can be a linking group or an end group.

As used herein, the term "amine" describes both a —NR'R" group and a —NR'— group, wherein R' and R" are each independently hydrogen, alkyl, cycloalkyl, aryl, alkaryl, heteroaryl, heteroalicyclic, as these terms are defined hereinbelow.

The amine group can therefore be a primary amine, where both R' and R" are hydrogen, a secondary amine, where R' is hydrogen and R" is alkyl, cycloalkyl or aryl, or a tertiary amine, where each of R' and R" is independently alkyl, cycloalkyl or aryl.

Alternatively, R' and R" can each independently be hydroxyalkyl, trihaloalkyl, alkenyl, alkynyl, amine, halide, sulfonate, sulfoxide, phosphonate, hydroxy, alkoxy, aryloxy, thiohydroxy, thioalkoxy, thioaryloxy, cyano, nitro, azo, sulfonamide, carbonyl, C-carboxylate, O-carboxylate, N-thiocarbamate, O-thiocarbamate, urea, thiourea, N-carbamate, O-carbamate, C-amide, N-amide, silyl, guanyl, guanidine and hydrazine.

The term "amine" is used herein to describe a —NR'R" group in cases where the amine is an end group, as defined hereinunder, and is used herein to describe a —NR'— group in cases where the amine is a linking group or is or part of a linking moiety.

The term "alkyl" describes a saturated aliphatic hydrocarbon including straight chain and branched chain groups. Preferably, the alkyl group has 1 to 20 carbon atoms. Whenever a numerical range; e.g., "1-20", is stated herein, it implies that the group, in this case the alkyl group, may contain 1 carbon atom, 2 carbon atoms, 3 carbon atoms, etc., up to and including 20 carbon atoms. More preferably, the alkyl is a medium size alkyl having 1 to 10 carbon atoms. Most preferably, unless otherwise indicated, the alkyl is a lower alkyl having 1 to 6, or 1 to 4 carbon atoms (C(1-4) alkyl).

The alkyl group may be substituted or unsubstituted. Substituted alkyl may have one or more substituents, whereby each substituent group can independently be, for example, hydroxyalkyl, trihaloalkyl, cycloalkyl, alkenyl, alkynyl, aryl, heteroaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, silyl, guanyl, guanidine and hydrazine.

The alkyl group can be an end group, as this phrase is defined hereinabove, wherein it is attached to a single adjacent atom, or a linking group, as this phrase is defined hereinabove, which connects two or more moieties via at least two carbons in its chain. When the alkyl is a linking group, it is also referred to herein as "alkylene" or "alkylene chain".

Alkene (or alkenyl) and Alkyne (or alkynyl), as used herein, are an alkyl, as defined herein, which contains one or more double bond or triple bond, respectively.

The term "cycloalkyl" describes an all-carbon monocyclic ring or fused rings (i.e., rings which share an adjacent pair of carbon atoms) group where one or more of the rings does not have a completely conjugated pi-electron system. Examples include, without limitation, cyclohexane, adamantine, norbornyl, isobornyl, and the like. The cycloalkyl group may be substituted or unsubstituted. Substituted cycloalkyl may have one or more substituents, whereby each substituent group can independently be, for example, hydroxyalkyl, trihaloalkyl, cycloalkyl, alkenyl, alkynyl, aryl, heteroaryl, alkaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, silyl, guanyl, guanidine and hydrazine. The cycloalkyl group can be an end group, as this phrase is defined hereinabove, wherein it is attached to a single adjacent atom, or a linking group, as this phrase is defined hereinabove, connecting two or more moieties at two or more positions thereof.

The term "heteroalicyclic" describes a monocyclic or fused ring group having in the ring(s) one or more atoms such as nitrogen, oxygen and sulfur. The rings may also have one or more double bonds. However, the rings do not have a completely conjugated pi-electron system. Representative examples are piperidine, piperazine, tetrahydrofuran, tetrahydropyrane, morpholine, oxalidine, and the like. The heteroalicyclic may be substituted or unsubstituted. Substituted heteroalicyclic may have one or more substituents, whereby each substituent group can independently be, for example, hydroxyalkyl, trihaloalkyl, cycloalkyl, alkenyl, alkynyl, aryl, heteroaryl, alkaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, silyl, guanyl, guanidine and hydrazine. The heteroalicyclic group can be an end group, as this phrase is defined hereinabove, where it is attached to a single adjacent atom, or a linking group, as this phrase is defined hereinabove, connecting two or more moieties at two or more positions thereof.

The term "aryl" describes an all-carbon monocyclic or fused-ring polycyclic (i.e., rings which share adjacent pairs of carbon atoms) groups having a completely conjugated pi-electron system. The aryl group may be substituted or unsubstituted. Substituted aryl may have one or more substituents, whereby each substituent group can independently be, for example, hydroxyalkyl, trihaloalkyl, cycloalkyl, alkenyl, alkynyl, aryl, heteroaryl, alkaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, N-carbamate, O-carbamate, C-amide, N-amide, silyl, guanyl, guanidine and hydrazine. The aryl group can be an end group, as this term is defined hereinabove, wherein it is attached to a single adjacent atom, or a linking group, as this term is defined hereinabove, connecting two or more moieties at two or more positions thereof.

The term "heteroaryl" describes a monocyclic or fused ring (i.e., rings which share an adjacent pair of atoms) group having in the ring(s) one or more atoms, such as, for example, nitrogen, oxygen and sulfur and, in addition, having a completely conjugated pi-electron system. Examples, without limitation, of heteroaryl groups include pyrrole, furan, thiophene, imidazole, oxazole, thiazole, pyrazole, pyridine, pyrimidine, quinoline, isoquinoline and purine. The heteroaryl group may be substituted or unsubstituted. Substituted heteroaryl may have one or more substituents, whereby each substituent group can independently be, for example, hydroxyalkyl, trihaloalkyl, cycloalkyl, alkenyl, alkynyl, aryl, heteroaryl, alkaryl, heteroalicyclic, amine, halide, sulfonate, sulfoxide, phosphonate, hydroxy, alkoxy, aryloxy, thiohydroxy, thioalkoxy, thioaryloxy, cyano, nitro, azo, sulfonamide, C-carboxylate, O-carboxylate, N-thiocarbamate, O-thiocarbamate, urea, thiourea, O-carbamate, N-carbamate, C-amide, N-amide, silyl, guanyl, guanidine and hydrazine.

The heteroaryl group can be an end group, as this phrase is defined hereinabove, where it is attached to a single adjacent atom, or a linking group, as this phrase is defined hereinabove, connecting two or more moieties at two or more positions thereof. Representative examples are pyridine, pyrrole, pyrrolidone, oxazole, indole, purine and the like.

The term "alkaryl" describes an alkyl, as defined herein, which is substituted by one or more aryl or heteroaryl groups, as defined herein. An example of alkaryl is benzyl.

The term "halide", "halogen" and "halo" describe fluorine, chlorine, bromine or iodine.

The term "haloalkyl" describes an alkyl group as defined above, further substituted by one or more halide.

The term "sulfate" describes a —O—S(=O)$_2$—OR' end group, as this term is defined hereinabove, or an —O—S(=O)$_2$—O— linking group, as these phrases are defined hereinabove, where R' is as defined hereinabove.

The term "thiosulfate" describes a —O—S(=S)(=O)—OR' end group or a —O—S(=S)(=O)—O— linking group, as these phrases are defined hereinabove, where R' is as defined hereinabove.

The term "sulfite" describes an —O—S(=O)—O—R' end group or a —O—S(=O)—O— group linking group, as these phrases are defined hereinabove, where R' is as defined hereinabove.

The term "thiosulfite" describes a —O—S(=S)—O—R' end group or an —O—S(=S)—O— group linking group, as these phrases are defined hereinabove, where R' is as defined hereinabove.

The term "sulfinate" describes a —S(=O)—OR' end group or an —S(=O)—O— group linking group, as these phrases are defined hereinabove, where R' is as defined hereinabove.

The term "sulfoxide" or "sulfinyl" describes a —S(=O)R' end group or an —S(=O)— linking group, as these phrases are defined hereinabove, where R' is as defined hereinabove.

The term "sulfonate" describes a —S(=O)$_2$—R' end group or an —S(=O)$_2$— linking group, as these phrases are defined hereinabove, where R' is as defined herein.

The term "S-sulfonamide" describes a —S(=O)$_2$—NR'R" end group or a —S(=O)$_2$—NR'— linking group, as these phrases are defined hereinabove, with R' and R" as defined herein.

The term "N-sulfonamide" describes an R'S(=O)$_2$—NR"— end group or a —S(=O)$_2$—NR'— linking group, as these phrases are defined hereinabove, where R' and R" are as defined herein.

The term "disulfide" refers to a —S—SR' end group or a —S—S— linking group, as these phrases are defined hereinabove, where R' is as defined herein.

The term "oxo" as used herein, describes a (=O) group, wherein an oxygen atom is linked by a double bond to the atom (e.g., carbon atom) at the indicated position.

The term "thiooxo" as used herein, describes a (=S) group, wherein a sulfur atom is linked by a double bond to the atom (e.g., carbon atom) at the indicated position.

The term "oxime" describes a =N—OH end group or a =N—O— linking group, as these phrases are defined hereinabove.

The term "hydroxyl" describes a —OH group.

The term "alkoxy" describes both an —O-alkyl and an —O-cycloalkyl group, as defined herein.

The term "aryloxy" describes both an —O-aryl and an —O-heteroaryl group, as defined herein.

The term "thiohydroxy" describes a —SH group.

The term "thioalkoxy" describes both a —S-alkyl group, and a —S-cycloalkyl group, as defined herein.

The term "thioaryloxy" describes both a —S-aryl and a —S-heteroaryl group, as defined herein.

The "hydroxyalkyl" is also referred to herein as "alcohol", and describes an alkyl, as defined herein, substituted by a hydroxy group.

The term "cyano" describes a —C≡N group.

The term "isocyanate" describes an —N=C=O group.

The term "isothiocyanate" describes an —N=C=S group.

The term "nitro" describes an —NO$_2$ group.

The term "acyl halide" describes a —(C=O)R"" group wherein R"" is halide, as defined hereinabove.

The term "azo" or "diazo" describes an —N=NR' end group or an —N=N— linking group, as these phrases are defined hereinabove, with R' as defined hereinabove.

The term "peroxo" describes an —O—OR' end group or an —O—O— linking group, as these phrases are defined hereinabove, with R' as defined hereinabove.

The term "carboxylate" as used herein encompasses C-carboxylate and O-carboxylate.

The term "C-carboxylate" describes a —C(=O)—OR' end group or a —C(=O)—O— linking group, as these phrases are defined hereinabove, where R' is as defined herein.

The term "O-carboxylate" describes a —OC(=O)R' end group or a —OC(=O)— linking group, as these phrases are defined hereinabove, where R' is as defined herein.

A carboxylate can be linear or cyclic. When cyclic, R' and the carbon atom are linked together to form a ring, in C-carboxylate, and this group is also referred to as lactone. Alternatively, R' and O are linked together to form a ring in O-carboxylate. Cyclic carboxylates can function as a linking group, for example, when an atom in the formed ring is linked to another group.

The term "thiocarboxylate" as used herein encompasses C-thiocarboxylate and O-thiocarboxylate.

The term "C-thiocarboxylate" describes a —C(=S)—OR' end group or a —C(=S)—O— linking group, as these phrases are defined hereinabove, where R' is as defined herein.

The term "O-thiocarboxylate" describes a —OC(=S)R' end group or a —OC(=S)— linking group, as these phrases are defined hereinabove, where R' is as defined herein.

A thiocarboxylate can be linear or cyclic. When cyclic, R' and the carbon atom are linked together to form a ring, in C-thiocarboxylate, and this group is also referred to as thiolactone. Alternatively, R' and O are linked together to form a ring in O-thiocarboxylate. Cyclic thiocarboxylates can function as a linking group, for example, when an atom in the formed ring is linked to another group.

The term "carbamate" as used herein encompasses N-carbamate and O-carbamate.

The term "N-carbamate" describes an R"OC(=O)—NR'- end group or a —OC(=O)—NR'-linking group, as these phrases are defined hereinabove, with R' and R" as defined herein.

The term "O-carbamate" describes an —OC(=O)—NR'R" end group or an —OC(=O)—NR'-linking group, as these phrases are defined hereinabove, with R' and R" as defined herein.

A carbamate can be linear or cyclic. When cyclic, R' and the carbon atom are linked together to form a ring, in O-carbamate. Alternatively, R' and O are linked together to form a ring in N-carbamate. Cyclic carbamates can function as a linking group, for example, when an atom in the formed ring is linked to another group.

The term "carbamate" as used herein encompasses N-carbamate and O-carbamate.

The term "thiocarbamate" as used herein encompasses N-thiocarbamate and O-thiocarbamate.

The term "O-thiocarbamate" describes a —OC(=S)—NR'R" end group or a —OC(=S)—NR'-linking group, as these phrases are defined hereinabove, with R' and R" as defined herein.

The term "N-thiocarbamate" describes an R"OC(=S)NR'— end group or a —OC(=S)NR'— linking group, as these phrases are defined hereinabove, with R' and R" as defined herein.

Thiocarbamates can be linear or cyclic, as described herein for carbamates.

The term "dithiocarbamate" as used herein encompasses S-dithiocarbamate and N-dithiocarbamate.

The term "S-dithiocarbamate" describes a —SC(=S)—NR'R" end group or a —SC(=S)NR'— linking group, as these phrases are defined hereinabove, with R' and R" as defined herein.

The term "N-dithiocarbamate" describes an R"SC(=S)NR'— end group or a —SC(=S)NR'— linking group, as these phrases are defined hereinabove, with R' and R" as defined herein.

The term "urea", which is also referred to herein as "ureido", describes a —NR'C(=O)—NR"R'" end group or a —NR'C(=O)—NR"— linking group, as these phrases are defined hereinabove, where R' and R" are as defined herein and R'" is as defined herein for R' and R".

The term "thiourea", which is also referred to herein as "thioureido", describes a —NR'—C(=S)—NR"R'" end group or a —NR'—C(=S)—NR"— linking group, with R', R" and R'" as defined herein.

The term "amide" as used herein encompasses C-amide and N-amide.

The term "C-amide" describes a —C(=O)—NR'R" end group or a —C(=O)—NR'— linking group, as these phrases are defined hereinabove, where R' and R" are as defined herein.

The term "N-amide" describes a R'C(=O)—NR"— end group or a R'C(=O)—N— linking group, as these phrases are defined hereinabove, where R' and R" are as defined herein.

An amide can be linear or cyclic. When cyclic, R' and the carbon atom are linked together to form a ring, in C-amide, and this group is also referred to as lactam. Cyclic amides can function as a linking group, for example, when an atom in the formed ring is linked to another group.

The term "guanyl" describes a R'R"NC(=N)— end group or a —R'NC(=N)— linking group, as these phrases are defined hereinabove, where R' and R" are as defined herein.

The term "guanidine" describes a —R'NC(=N)—NR"R''' end group or a —R'NC(=N)— NR"— linking group, as these phrases are defined hereinabove, where R', R" and R''' are as defined herein.

The term "hydrazine" describes a —NR'—NR"R''' end group or a —NR'—NR"— linking group, as these phrases are defined hereinabove, with R', R", and R''' as defined herein.

As used herein, the term "hydrazide" describes a —C(=O)—NR'—NR"R''' end group or a —C(=O)—NR'—NR"— linking group, as these phrases are defined hereinabove, where R', R" and R''' are as defined herein.

As used herein, the term "thiohydrazide" describes a —C(=S)—NR'—NR"R''' end group or a —C(=S)—NR'—NR"— linking group, as these phrases are defined hereinabove, where R', R" and R''' are as defined herein.

As used herein, the term "alkylene glycol" describes a —O—[(CR'R")$_z$—O]$_y$R''' end group or a —O—[(CR'R")$_z$—O]$_y$— linking group, with R', R" and R''' being as defined herein, and with z being an integer of from 1 to 10, preferably, 2-6, more preferably 2 or 3, and y being an integer of 1 or more. Preferably R' and R" are both hydrogen.

When z is 2 and y is 1, this group is ethylene glycol. When z is 3 and y is 1, this group is propylene glycol.

When y is greater than 4, the alkylene glycol is referred to herein as poly(alkylene glycol). In some embodiments of the present invention, a poly(alkylene glycol) group or moiety can have from 10 to 200 repeating alkylene glycol units, such that z is 10 to 200, preferably 10-100, more preferably 10-50.

The term "silyl" describes a —SiR'R"R''' end group or a —SiR'R"— linking group, as these phrases are defined hereinabove, whereby each of R', R" and R''' are as defined herein.

The term "siloxy" describes a —Si(OR')R"R''' end group or a —Si(OR')R"— linking group, as these phrases are defined hereinabove, whereby each of R', R" and R''' are as defined herein.

The term "silaza" describes a —Si(NR'R")R''' end group or a —Si(NR'R")— linking group, as these phrases are defined hereinabove, whereby each of R', R" and R''' is as defined herein.

The term "silicate" describes a —O—Si(OR')(OR") (OR''') end group or a —O—Si(OR')(OR")— linking group, as these phrases are defined hereinabove, with R', R" and R''' as defined herein.

The term "phosphonate" describes a —P(=O)(OR')(OR") end group or a —P(=O)(OR')(O)— linking group, as these phrases are defined hereinabove, with R' and R" as defined herein.

The term "thiophosphonate" describes a —P(=S)(OR')(OR") end group or a —P(=S)(OR')(O)— linking group, as these phrases are defined hereinabove, with R' and R" as defined herein.

The term "phosphinyl" describes a —PR'R" end group or a —PR'— linking group, as these phrases are defined hereinabove, with R' and R" as defined hereinabove.

The term "phosphine oxide" describes a —P(=O)(R') (R") end group or a —P(=O)(R')— linking group, as these phrases are defined hereinabove, with R' and R" as defined herein.

The term "phosphine sulfide" describes a —P(=S)(R') (R") end group or a —P(=S)(R')— linking group, as these phrases are defined hereinabove, with R' and R" as defined herein.

The term "phosphite" describes an —O—PR'(=O)(OR") end group or an —O—PH(=O)(O)— linking group, as these phrases are defined hereinabove, with R' and R" as defined herein.

The term "carbonyl" or "carbonate" as used herein, describes a —C(=O)—R' end group or a —C(=O)— linking group, as these phrases are defined hereinabove, with R' as defined herein. This term encompasses ketones and aldehydes.

The term "thiocarbonyl" as used herein, describes a —C(=S)—R' end group or a —C(=S)— linking group, as these phrases are defined hereinabove, with R' as defined herein.

The term "oxime" describes a =N—OH end group or a =N—O— linking group, as these phrases are defined hereinabove.

The term "cyclic ring" encompasses a cycloalkyl, a heteroalicyclic, an aryl (an aromatic ring) and a heteroaryl (a hetero aromatic ring).

Other chemical groups are to be regarded according to the common definition thereof in the art and/or in line of the definitions provided herein.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

This Example presents small (about 20 nm by 300 nm) red, green, blue, violet (RGBV) filter-free spectrally-specific FET detectors. The detectors in this example are based on an individual color-specific organic-SiNW hybrid FET device, each being capable of detecting specific visible spectrum under 100 nm FWHM, omitting the need for a physical electric gate bias. Each individual SiNW is a spectrally gated FET (SGFET) which is modulated by a distinctive visible spectrum of red green blue and violet light, according to its specific organic fluorophore functionalization, serving as a negative bias on a p-type SiNW FET.

The spectral-specific RGBV induction is accomplished via covalent attachment of different fluorophore monolayers, which transfer an electron to the nanowire's oxide layer as a result of light absorbance at the appropriate RGBV spectrum. The photo-induced electrons cause the formation a negatively charged electret-like layer, which in turn changes the device conductivity. The reciprocal positive bias equivalent is obtained using ultraviolet (UV) light induced ionization.

This Example demonstrates that suspended SiNW devices can store discrete ON and OFF states for several days at ambient conditions. This Example also demonstrates the fabrication of a single-nanostructure multicolor detector device which may serve as a multicolor single pixel nano-detector.

Spectral discrimination by photodetectors is conventionally achieved using broadband inorganic semiconductor photodiodes, in combination with dichroic mirrors or a set of optical filters. Conventional techniques for narrowband photodetection fail to provide spectrally tunable narrowband responses with full width at half-maxima (FWHM) of less than 100 nm.

The high surface-to-volume ratios associated with nanostructures, make their electrical properties extremely sensitive to charges adsorbed on their surfaces and altering the nanowire's surface potential [18,19]. This change in the electrical field alters the carrier density within the nanowire structure, through electrostatic gating and/or charge transfer, resulting in changes in the device measured current [20]. Nanowires can be synthesized with a fine control over their diameter, length, chemical composition [21], doping/electrical properties and shape [22-26], and with the ability to create large-scale arrays of discrete nanowire elements [27-29].

Recently, dye-sensitized (porphyrin) thin films were shown to induce electric current changes in SiNWs by light-induced field effect (FET) gating [30]. The present Inventors found that these devices are not spectrally selective, nor can they optically control the electrical ON/OFF state of the device.

In this Example, the effect of photo-induced fluorophore-mediated electron transfer is studied in conjugation with SiNWs in dry environment, to achieve spectral-specific nano-detectors. The experiments in this Example are described with reference to FIGS. 6A through 22.

FIGS. 6A-J show the architecture and characteristics of a SGFET RGBV devices fabricated according to some embodiments of the present invention. FIG. 6A is an RGBV sensing chip array mounted on dedicated printed circuit board (PCB) using wire bonding, consisting of about 200 SGFET devices arranged in 4 regions, each being modified with different fluorophore. FIG. 6B is a high-magnification of one out of 4 sections of the SGFET arrays chip displaying the devices arrangement. FIG. 6C is a SEM image of the SGFET device, where a SiNW is visibly connected by the source and the drain electrodes.

FIG. 6D shows emission spectra of SiNWs modified with different Alexa-fluorophore derivatives, (top to bottom) Alexa-610 (red emission), Alexa-555 (orange emission), Alexa-488 (green emission) and Alexa-430 (green emission). FIG. 6E is a SEM image of sub-micron SGFET device, fabricated through e-beam lithography, displaying a single SiNW connected with source and drain electrodes. FIG. 6F is a high-magnification SEM image of the same 300 nm source-to-drain SGFET device from FIG. 6E. FIG. 6G shows schematic illustration of a 4-color RGBV SGFET detector fabricated by dry-transfer of SiNWs onto a 600 nm $SiO_2$ p-type Si wafer, demonstrating the electrical performance at $V_{sd}$=0.2 V. The chip was grounded or otherwise connected to a back-gate $V_g$. Each section of the RGBV device is represented by one modified SGFET, whereas upon spectral illumination every SGFET detect a specific wavelength as determined by the attached fluorophore absorbance. FIG. 6H shows typical $I_{sd}$-$V_{sd}$ curves of a p-type SGFET device post-modification for different $V_g$ (−9V to 9 V). FIG. 6I is a laser reflection image taken by a laser scanning microscope (LSM), displaying one Alexa-488 modified SiNW forming a blue-SGFET device. Areas A-C indicate the different scan areas (area A, SiNW; area B, electrode; area C, SiNW/electrode connection).

FIG. 6J shows $I_{sd}$ current measurements of the device shown in FIG. 6I demonstrating the spectral-specific sensitivity of each designated area (A-C) in FIG. 6I, following different laser excitations (633 nm, 546 nm and 488 nm). Only the nanowire part (A, blue line) reacts only to the blue 488 nm laser. B part was also excited with a higher laser energy (20%) showing no photoelectrical effect.

Figure 7A:
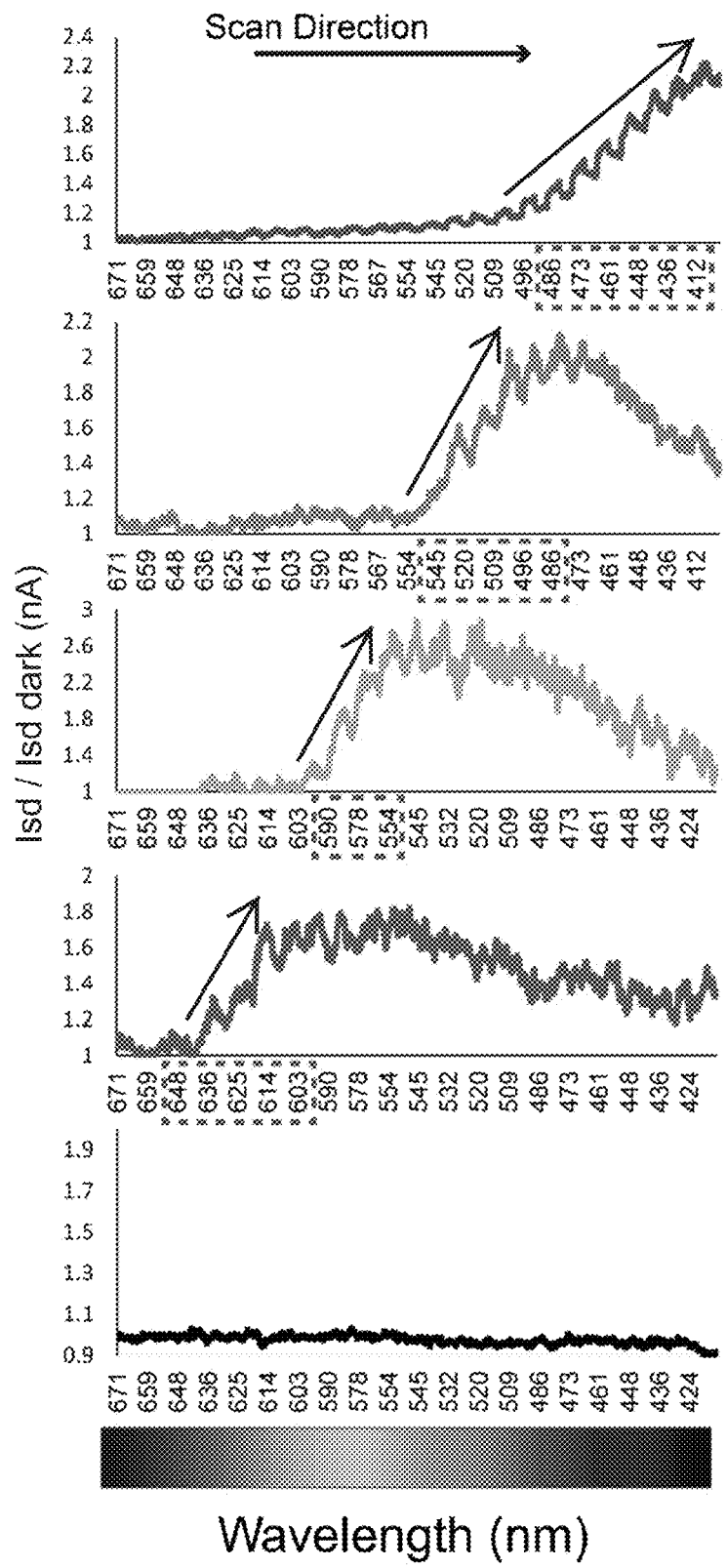

FIGS. 7A-E show spectral-specific response of the SGFET devices of the present embodiments. FIG. 7A shows visible spectral response of unmodified as well as different R/G/B/V-modified SGFET devices, sequentially scanned from the red 700 nm to the 400 nm violet section. The spectral response $I_{sd}^{light}/I_{sd}^{dark}$ current change of the different, top to bottom, violet (Alexa-430), blue (Alexa-488), green (Alexa-555), red (Alexa-610) devices, presented as a function of wavelength 700-400 nm (2.5±1 mW cm$^{-2}$), using monochromatic excitation with 10-12 nm steps at a total scan time of about 300 seconds.

Figure 7B:
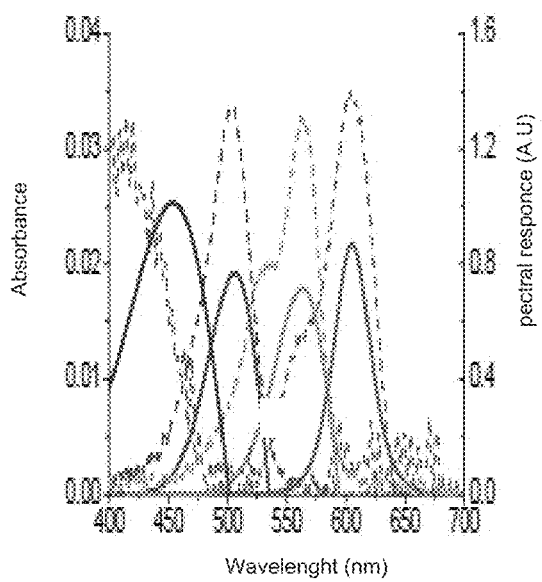
Figure 7C:
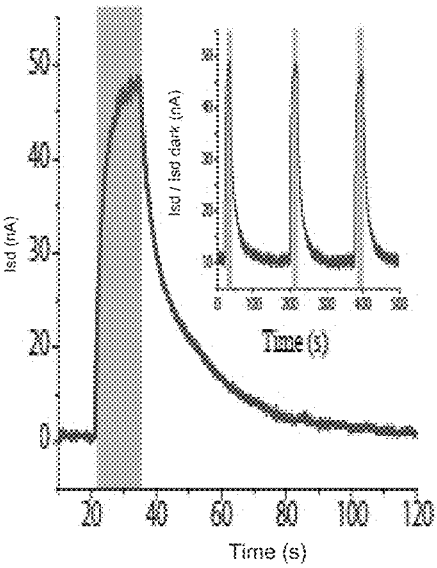

The spectral specificity is represented by an increase in the $I_{sd}^{light}/I_{sd}^{dark}$ current change, the responsive section in the graph are designated by arrows, and the responsive associated wavelengths are indicated as dashed boxes as follows: violet (486 nm-436 nm); blue (532 nm-486 nm); green (554 nm-590 nm); red (603 nm-648 nm). (All indicated wavelengths represent the center of the monochromatic excitation beam and have a ±6 nm shift due to the 10-12 nm band width). FIG. 7B shows absorbance spectrum of glass modified with the different Alexa fluorophores (Alexa 430, 488, 555, 610) as measured by a spectrophotometer (arbitrary units, dashed lines), and calculated spectral response of the different RGBV SGFETs (solid lines). Note the close overlap between the absorbance spectrum and the RGBV SGFET responses. FIG. 7C shows typical time-response of SGFETs (shown for blue-SGFET) $I_{sd}$ current as a function of time, blue excitation (120 mw cm$^{-2}$, pulse duration is indicated in blue). Calculated rise time=6.1 s, decay time=35.6 s, t1=2.3 s, t2=15.9 s inset: sequential blue excitation cycles.

Figure 7D:
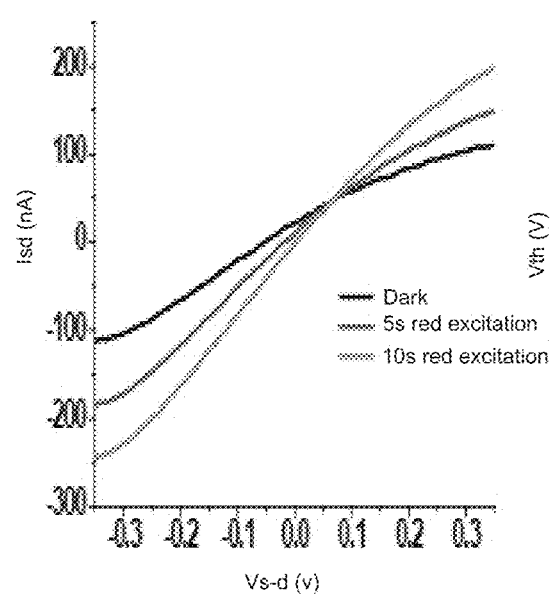
Figure 7E:
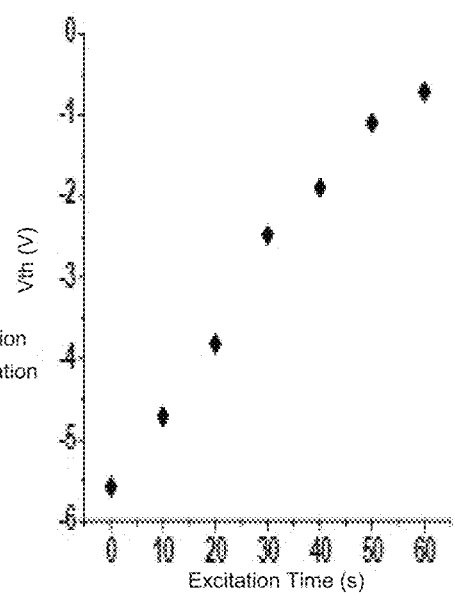

FIG. 7D shows $I_{sd}$-$V_{sd}$ curves of p-type red-SGFET device without illumination, and following 5 and 10 s illuminations cycles of red light excitation. Note the negative gate-like effect of the spectral-specific excitation. FIG. 7E shows calculated $V_{th}$ (calculated from FIG. 14A) shift of green-SGFET device as a function of green light excitation time (2 mW cm$^{-2}$).

FIGS. 8A-H show accumulation and dissipation of negative charges following spectral-specific excitation of the SGFET devices of the present embodiments. FIG. 8A is an AFM scan of 5 μm×5 μm area of Alexa-555 modified p-type about 80 nm diameter SiNWs, which were dry-transferred onto a native oxide p-type silicon wafer. SiNWs bright suspended sections are marked by arrowheads, flat SiNWs sections are marked by arrows, and partly suspended parts are marked by asterisk also in FIG. 8B, FIG. 8C and FIG. 8D.

FIGS. 8B-D show KPFM scanning of the same area as in FIG. 8A, bright color represents some more positive areas. FIG. 8B is a KPFM scan displaying similar electrical potential distribution along all of the SiNWs, as well as the wafer surface. FIG. 8C was obtained following 40 s of spectral-specific green light excitation at 546 nm (200 mW cm$^{-2}$), displaying bright positively charged areas in suspended (arrowhead), as well as semi-suspended, areas (asterisk). FIG. 8D was obtained one hour post-excitation only suspended areas (arrowhead) of the SiNWs still retained their positive charges triggered by the light excitation. FIG. 8E is a SEM image of a suspended SGFET device.

FIG. 8F shows long-term measurements under ambient conditions of the $I_{sd}^{light}/I_{sd}^{dark}$ current change, following spectral-specific blue excitation for 20 s (2 mW cm$^{-2}$), the device retains about 2 fold of the original value (before excitation) for about 14 hours. Inset: First 2 minutes post-excitation. Note that planar SGFETs revert back to their original value about 1 minute post-excitation (for comparison see FIG. 7C). FIGS. 8G and 8H illustrate a model for charge dissipation following spectral-specific excitation of planar (FIG. 8G) and suspended (FIG. 8H) SGFETs. Accumulated charges at planar SGFETs dissipate relatively fast from the SiNW's oxide surface to the adjacent oxide surface of the silicon wafer, whereas in suspended SGFETs the SiNW is isolated from the wafer surface and can only dissipate slowly along the nanowire axis towards the passivated electrodes.

Figure 9A:
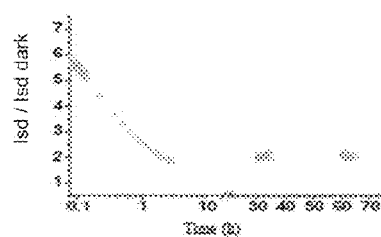
Figure 9B:
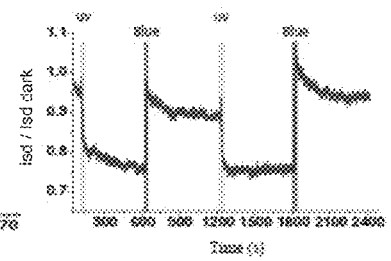
Figure 9C:
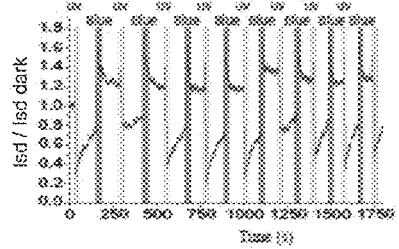
Figure 9D:
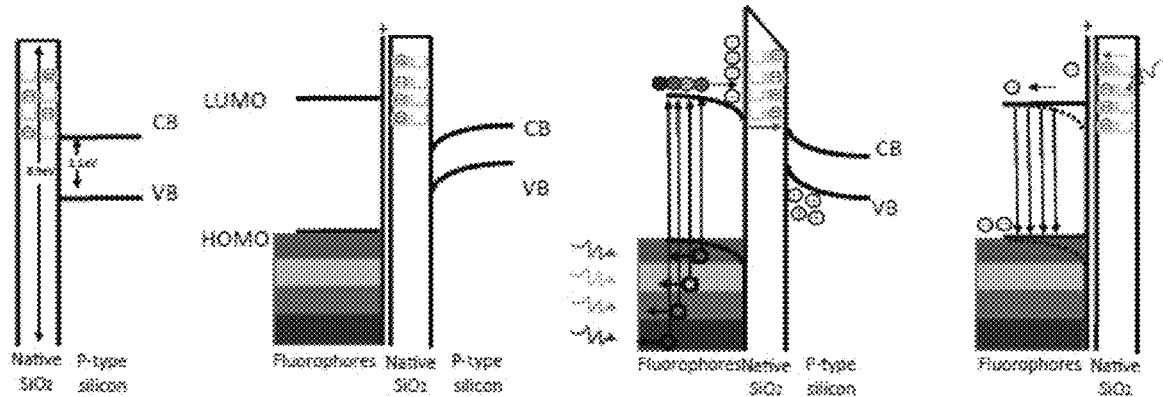

FIGS. 9A-D show spectra control of the ON and OFF states of suspended SGFET nonvolatile memory elements, according to some embodiments of the present invention. FIG. 9A shows spectrally-induced long-term nonvolatile memory effect of blue-SGFETs following spectral-specific blue excitation for 20 s (2 mW cm$^{-2}$), the device retains about 2 fold of the original baseline value (before excitation) for about 3 days under ambient conditions. Breaks in the graph demonstrate the nonvolatile capability of the retention of memory effect in the absence of $V_{sd}$ electrical potential. FIGS. 9B and 9C shows sequentially excitation cycles of blue (5 s, 20 mW cm$^{-2}$) and UV (2 s, 25 mW cm$^{-2}$) cycles controlling the level of $I_{sd}^{light}/I_{sd}^{UV}$ current at an interval of b (about 10 min) and c (about 1 min). FIG. 9D illustrates a model for SGFETs operation (illustrations D1 and D2), and for spectral-specific UV light control over the of $I_{sd}^{light}/I_{sd}^{UV}$ of the SGFET devices (illustrations D3). The model illustrate the different R/G/B/V fluorophores attached to the silicon oxide surface of a p-type SiNW, and the appropriate estimated energy band diagrams.

FIG. 9D, illustration 1, shows the estimated energy band diagrams for unmodified bare SiNW FET with native oxide as the dielectric layer, consist of evenly distributed electron in the oxide traps. APDMES and fluorophore modification (FIG. 9D, illustration 2) forms a positive charged dipole at the surface of the SiNW which results in a shift of tarped electrons towards the outer surface of the oxide, producing band banding and the depletion of the wire conductive channel. The corresponding HOMO-LUMO energy levels for the different RGBV (Alexa-610, 555, 488 and 430) fluorophores absorbance energy are indicted also in FIG. 9D-2. Upon spectral-specific excitation (FIG. 9D, illustration 3), a photon is absorbed by the appropriate fluorophore, causing an excitation of an electron to its LUMO state. Some of these excited electrons are injected onto the SiO$_2$ surface where they accumulate pushing the trapped electrons towards the inner surface of the oxide forming a strong negative band bending. This band bending causes an accumulation of holes in the SiNW adjacent to the Si—SiO$_2$ interface, which results in a large conducting channel and an elevation in the SiNW conductivity as well as a shift in the $V_{th}$ (FIG. 21C). In the case of planar SGFETs the device is relaxed back to its base state in a matter of seconds (FIG. 7C), whereas in the case of suspended SGFET, as previously described in (FIG. 8F), the electrons accumulated at the oxide surface persists for days at ambient conditions.

UV illumination (FIG. 9D, illustration 4) induces ionization of electrons held in traps at the inner part of the oxide layer to the outer oxide layer and as a consequence reintroduce electrons back into the fluorophore layer, reverting the wire conductivity back to its state before fluorophore excitation. This repeated interplay between the fluorophores spectral-specific excited electrons and the UV oxide ionization allows control over the 'on'/'off' state of our SGFETs.

Figure 10A:
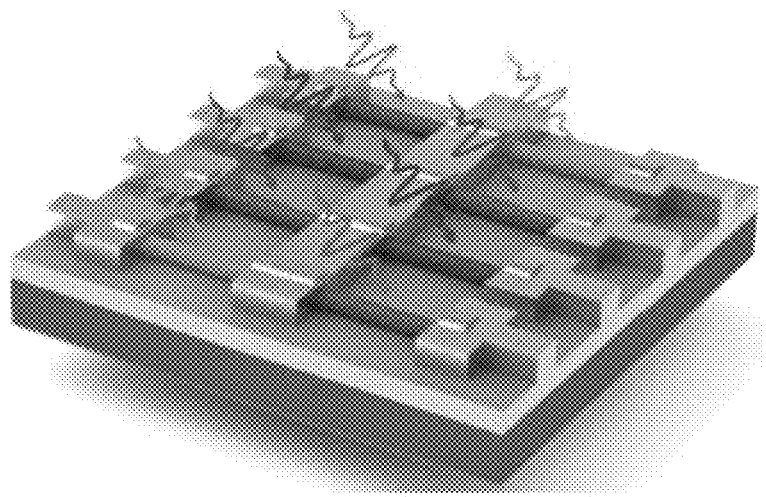
Figure 10B:
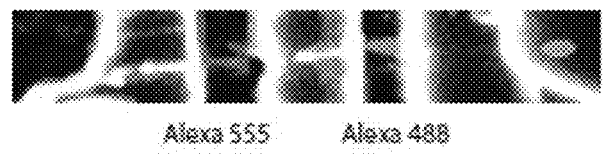
Figure 10C:
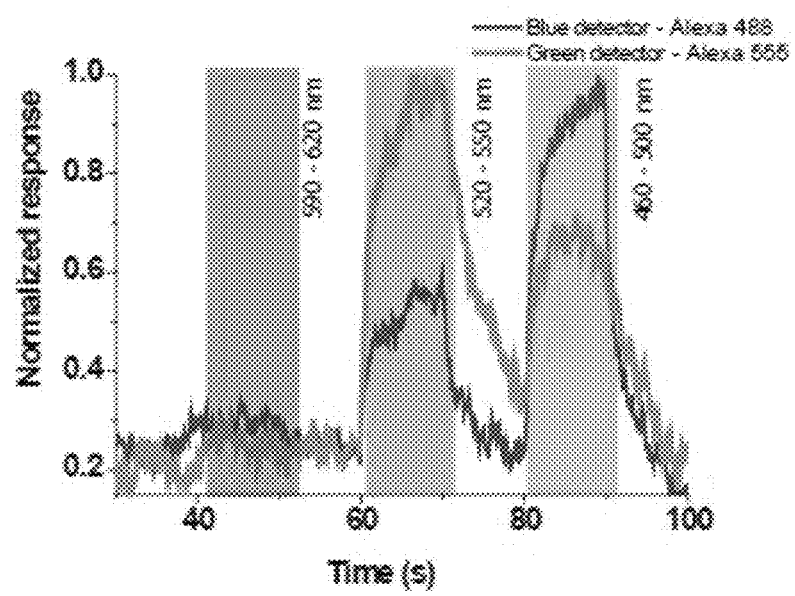

FIGS. 10A-E show results for a single-nanowire dual-pixel nanodetector according to some embodiments of the present invention. FIG. 10A illustrates a multi-color dual-pixel SGFET array Architecture illustration, displaying 2 pairs of single-nanowire, 4 color, dual-Pixel elements, covering the entire visual spectrum in a highly confined area. FIG. 10B is fluorescence image of the site-specific Alexa modification of a green (Alexa 555—red emission, left section)/blue (Alexa 488—green emission, right section) dual-color SGFET. FIG. 10C shows normalized color response of a single-nanowire dual-pixel green-blue nanodetectors (excitation band-pass filters spectrum are indicated at the side each excitation 10 s pulse) displaying spectral-specific response of each dual-SGFET detector with some crosstalk due to the fluorophore absorbance overlapping spectrum. FIG. 10D is fluorescence image of the site-specific Alexa modification of a red (Alexa 610—red emission, left section)—violet (Alexa 430—green emission, right section). FIG. 10E shows normalized color response of a single-nanowire dual-pixel red-violet nanodetectors, excitation band-pass filters spectrum are indicated at the side each excitation pulse, displaying highly spectral-specific response of each dual-SGFET detector with a minimal crosstalk due to the fluorophore absorbance large separation.

FIGS. 11A-B show results of Alexa-flour modification of RGBV sensing chips, according to some embodiments of the present invention. FIG. 11A is an image of the RGBV SGFET chip array modification process using microfluidic PDMS channels. FIG. 11B shows representative $I_{sd}$-$V_{sd}$ curves of a p-type SGFET before chemical modification for different $V_g$ (−9V to 9 V).

FIGS. 12A1-A5 and 12B show schematic illustrations (FIG. 12A1-A5) and electrical characterization (FIG. 12B) of SGFETs SiNW-restricted fluorophore modification scheme. FIGS. 12A1-A5 schematically illustrate a typical post-fabrication chemical functionalization of APDMES followed by NHS-fluorophore modification, which results in the chemical modification of the SiNWs as well as the wafer surface. Addition of a preliminary step of atomic layer deposition (ALD) coating of a thin 5 nm Alumina layer, followed by functionalization of APDMES, removal of the Alumina sacrificial layer using 0.1M phosphoric acid followed by NHS fluorophore modification, results in SiNWs-restricted chemical modification. FIG. 12B shows electrical characterization of the $I_{sd}/I_{sd}^{dark}$ current following spectral-specific excitation in chip with modified SiNWs+wafer surface versus SiNWs-restricted modification, displaying fast charge dissipation in the SiNWs-restricted SGFETs.

FIGS. 13A-C show sub-micron Blue-SGFET Spectral-Specific Response. FIG. 13A shows spectral response of a about 20 nm diameter and about 300 nm long blue-SGFET device (Alexa-488) showing the $I_{sd}/I_{sd}^{dark}$ current change as a function of wavelength. Note the specific response at a wavelength of 529 nm-467 nm corresponding to the absorbance of Alexa-488 (see FIG. 7B). FIG. 13B shows response of a sub-micron blue-SGFET to pulse excitation at 488 nm (1.5 s, 2 mw cm$^{-2}$). Note the relatively fast excitation and decay times. FIG. 13C shows electrical transconductance characteristic of the SGFET device post-modification.

Figure 14A:
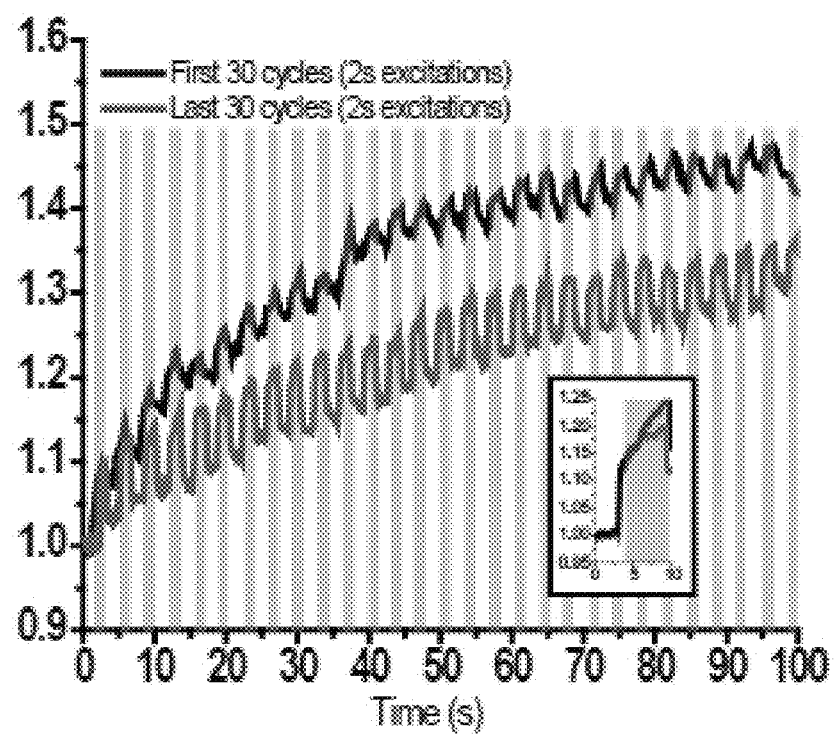
Figure 14B:
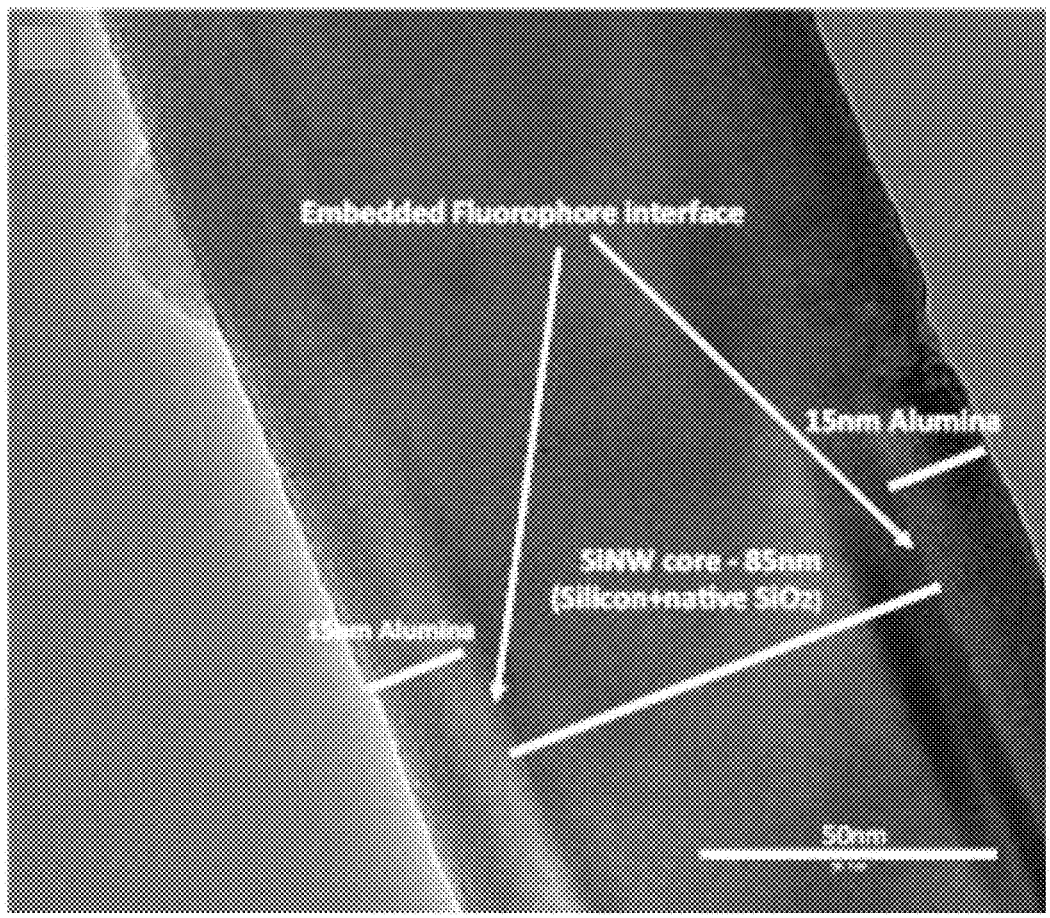

FIGS. 14A-F demonstrate the durability of the fluorophore modified SiNWs in an Alumina transparent shell. FIG. 14A display the SGFET response following multi excitation steps of 140.000 cycles of 2 s each the plot indicating the first 30 second excitation (in black) as compared with the last 30 s out of 140.000 cycles (in red), inset sow longer 7 s excitation period at the beginning and following 140.000 cycles. FIG. 14B is SEM image of Alexa 488 modified SiNW embedded in a 15 nm ALD alumina layer (arrows indicating the location of the organic fluorophore layer). FIGS. 14C-E are images of Alumina embedded (FIG. 14C) Alexa 488 modified nanowires and exposed Alexa 488 SiNWs (FIG. 14D) subjected to 5 min, 50 W O$_2$ Plasma. Plasma treatment of unembedded Alexa modified SiNWs resulted in the destruction of the attached fluorophores as shown by the absent of green emission detection in FIG. 14E. Similar experiment using Alumina embedded modified SiNWs display bright emission as a result from the physical protection of the Alumina encapsulation (FIG. 14F).

FIGS. 15A-C show results of measurements with a field-effect of SGFETs following spectral-specific excitation. FIG. 15A shows Blue-SGFET $I_{sd}/I_{sd}$ dark current change, as a function of excitation energy in the range of 40-220 mJ cm$^{-2}$. FIG. 15B shows electrical transconductance characteristic of a red-SGFET device following red light excitation (2 mW cm$^{-2}$) at different $V_g$ voltage bias, FIG. 15C shows spectral-specific current elevation of $I_{sd}$ as a function of different $V_g$ bias (blue columns), plotted against the electrical transconductance measured using corresponding Vg biasing (black line).

Figure 16A:
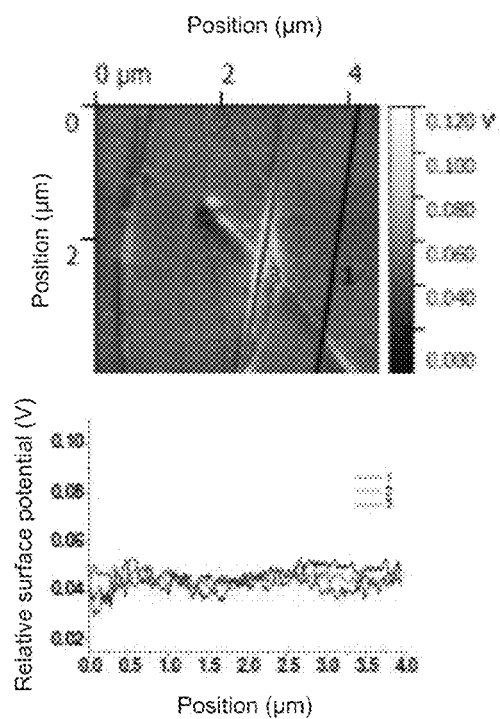
Figure 16B:
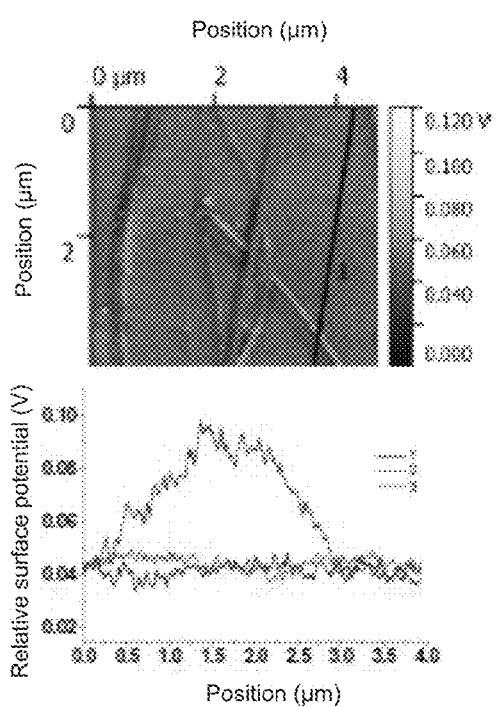

FIGS. 16A-D show KPFM measurements of spectral specific charge accumulation of fluorophore modified SiNWs. FIGS. 16A and 16B show scanning micrographs of Alexa 555 modified SiNWs (scanned bottom up) before (FIG. 16A) and 10 min following (FIG. 16A) green light excitation which resulted in a positive electric potential shift which originates due to electrons relocating from the fluorophore layer towards the SiNWs. FIGS. 16C and 16D show graphs of corresponding black red and blue lines as indicated in FIGS. 16A and 16B respectively demonstrating about 60 mV change only at elevated SINWs.

FIGS. 17A and 17B show electrical Characteristics of Suspended SGFETs. Suspended 80 nm diameter 6 µm long SGFETs (see FIG. 8E) electrical characteristics. FIG. 17A shows typical $I_{sd}$-$V_{sd}$ curves of p-type SGFETs before modification for different $V_g$ (-6V to 6 V) and FIG. 17B shows electrical transconductance characteristics, all before modification.

FIG. 18 shows long-term memory effect under ambient conditions of green-SGFETs. Spectrally-induced long-term nonvolatile memory effect of green-SGFETs, following spectral-specific green excitation for 20 s (2 mW cm$^{-2}$). The device retains about 4 fold of its original current value (before excitation) for about 2 days under ambient conditions. Breaks in the graph demonstrate the nonvolatile capability of the retention of memory effect in the absence of $V_{sd}$ electric potential.

FIGS. 19A and 19B show results obtained by UV Illumination of the SGFETs. FIG. 19A shows spectral response of p-type and n-type unmodified FET devices displaying the reciprocal effect of UV illumination as reduction in the $I_{sd}/I_{sd}^{off}$ in p-type SiNWs FET vs elevation of $I_{sd}/I_{sd}^{dark}$ current in n-type SiNWs FET. FIG. 19B shows n-type blue-SGFET sequential excitation of blue (20 s, 20 mW cm$^{-2}$) and UV (10 s, 25 mW cm$^{-2}$) illumination cycles, controlling the level of $I_{sd}/I_{sd}^{dark}$ current ratio at an interval of about 1 minute, displaying the reciprocal effect of $I_{sd}/I_{sd}^{dark}$ current elevation upon UV illumination and current reduction upon blue excitation (for comparison see FIGS. 9B, 9C and 18).

FIGS. 20A and 20B demonstrate spectral Control of the ON and OFF State of suspended green-SGFET nonvolatile memory element. Sequential excitation of green-SGFETs by green light (20 s, 20 mW cm$^{-2}$) and UV illumination (10 s, 25 mW cm$^{-2}$), which control the level of $I_{sd}/I_{sd}^{dark}$ current change, at an interval of about 10 min (FIG. 20A) and about 1 min (FIG. 20B).

FIGS. 21A-C shows electrical TC analysis of planar SGFETs. FIG. 21A shows TC analysis of planar SiNW FET demonstrating clockwise hysteresis suggesting oxide traps involvement in the field effect response. FIG. 21B shows TC analysis of SiNW FET before (black) and after (red) APDMES and fluorophore (Alexa 610) modification displaying large about -20 v $V_{th}$ shift. FIG. 21C shows TC analysis of Alexa 610 modified in dark (blue) and following 60 s red light excitation displaying a about 10v $V_{th}$ shift.

FIG. 22 schematically illustrates fabrication process of a single SiNW for multi-color detection according to some embodiments of the present invention.

Device Fabrication and Architecture

P-type boron-doped silicon nanowires (as well as n-type) were grown by vapor-liquid-solid chemical vapor deposition method, followed by dry transferring to their destined locations on a silicon wafer, and the formation of electrical contacts by common lithography and metal deposition steps. SiNWs of 80 nm and 20 nm diameter were used as the sensing elements in the spectrally-gated field effect transistor devices (see Supplementary Information section, below). These SiNWs were used as part of a sensing FETs multi-array chip (FIG. 6A) which results in about 200 devices, about 6 µm in length (source-to-drain distance), planar SiNWs FET devices. Chips were fabricated bottom-up on a 600 nm thermal oxide silicon p-type wafer. The chip consisted of four sensing areas, where each area was chemically-modified to detect a different wavelength, as indicated in (FIGS. 6A and 6H) for the different RGBV color detection (see also FIG. 11A). In addition, FET devices of smaller dimensions, 300 nm source-to-drain distance, were fabricated by the transfer of SiNWs onto a silicon wafer, followed by e-beam lithography to define the source and drain electrodes (FIGS. 6E and 6F).

SiNWs were chemically-functionalized using 3-aminopropyldimethyl ethoxysilane (APDMES), followed by the crosslinking of amine-reactive Alexa-fluorophore NHS ester derivatives. The following commercially available Alexa fluorophores were used: Alexa 430, Alexa 488, Alexa 555 and Alexa 610. Chemical modification was performed post-fabrication, effectively covering the whole SiNWs, as well as the wafer, surfaces. Whenever SiNWs were to be selectively modified (without modification of the whole wafer surface), the silicon wafer was pre-coated with a thin (about 5 nm in thickness) alumina layer which serves as sacrificial layer, then removed after the APDMES functionalization step, and just before the NWs modification with the different fluorophore molecules (FIGS. 12A1-A5 and 12B).

Spectral-Specific Response of Fluorophore-Embedded SiNWs-Based Devices

SiNWs SGFET devices were functionalized using APDMES followed by the amine-reactive crosslinking of different Alexa fluor-NHS esters (illustrated in FIGS. 6A and 6H), and as can be observed by their corresponding fluorescence emission (FIG. 6D and FIG. 11A). A representative current-to-voltage (I-V) curve characteristic of a fluorophore-modified SiNW SGFET device is presented in FIG. 6G. For comparison, a typical I-V curve of a bare-SiNW FET device, as well as its transconductance, is presented in FIG. 11B. The spectral response of the Alexa 488-modified SiNWs (blue-SGFET) was first tested, using a laser scanning microscope (FIGS. 6I and 6J). These set of experiments were preformed using suspended SiNWs FET devices, in order to exclude any effect which may originate due to the concomitant chemical modification of the device's surrounding surfaces.

Suspended SiNWs FET devices were fabricated using pre-etching of the silicon oxide layer between the inner-electrodes, for the formation of trench structures using reactive ion etching (RIE), leading to suspended SiNW elements attached to metal electrodes array (see SEM image as inset in FIG. 6I). The microscope was accommodated with 633 nm (10 mW), 546 nm (10 mW) and 488 nm (7.5 mW) lasers. All lasers were set to 1% of their power output, and only the area of the nanowire was excited for 10 seconds using all three lasers sequentially (FIG. 6I area A). As shown in FIG. 6J (blue line), the blue detector nanodevice only responds to the blue 488 nm laser, as manifested by the $I_{sd}$ current elevation, up to 150% above its electrical baseline ($I_{sd}^{light}/I_{sd}^{dark}$). To be certain that the SiNW part of the device is responsible for the spectral-specific effect, different parts of the SGFET device were tested, including the SiNW itself (FIG. 6I, area A), the area of the electrodes (FIG. 6I, area B), as well as the area where the SiNW is connected to the metal electrodes (FIG. 6I, area C).

The results indicate that only the SiNW area is accountable for the observed spectral-specific effect, and also an illumination with a higher 20% laser power on electrodes areas did not result in any SGFET $I_{sd}$ current elevation. This demonstrated the spectral specific photo-induced $I_{sd}$ current elevation, similarly to the appliance of negative gate bias in p-type SiNW FETs.

To extend the spectral detection of the inventive devices, experiments were made with different fluorophores with absorbance spanning the entire visible spectrum: Alexa-430 (violet-nanodetector), Alexa-488 (blue-nanodetector), Alexa-555 (green-nanodetector) and Alexa-610 (red-nanodetector) functionalized planar devices (using nanowires of 80 nm in diameter for the fabrication of 6 µm in length SiNWs devices), as well as unfunctionalized SiNWs as reference non-specific nanodetector. This time, the spectral-electrical response of the different fluorophore-modified SiNWs detectors was tested using a xenon monochromatic light source (Polychromator IV, Till Photonics) sequential scan of the visual spectrum from the red (700 nm) to the violet (400 nm) (FIG. 7A). The total scan time was about 300 seconds, at intervals of 10-12 nm spectral bandwidth (at 4 s intervals). The different Alexa-modified p-type SiNWs devices exhibit a clear elevation in their $I_{sd}$ current following spectral-specific response, and show no change in non-responsive spectral regions.

Examining the response curve of the Alexa-430 nanodetector (violet-nanodetector), demonstrates that light excitation ranging from 486 nm to about 700 nm does not induce any change in the $I_{sd}$ current of the SGFET detector, however starting at about 486 nm to about 412 nm there is a marked 2.2 fold elevation of the $I_{sd}$ current, relatively to the dark state level of the device ($I_{sd}/I_{sd}^{dark}$). This part is referred to as the spectral-specific effect, corresponding well to the expected absorbance spectrum of the fluorophore anchored to the SiNW devices (FIG. 7B).

Further illumination from 412 nm did not cause changes in the measured conductivity, and the $I_{sd}$ current gradually reverts back to its baseline level, as can be clearly seen in all the fabricated fluorophore-modified SiNW RGB detectors. The spectral response of the devices was calculated (FIG. 7B, solid lines). Calculation of the full-width at half-maximum (FWHM), and the relative responsiveness of each color nanodetector (FIG. 7B) reveals FWHM values of under 100 nm for all RGBV detectors: 38 nm, 45 nm, 49 nm and 94 nm for the red, blue, green and violet nanodetectors, respectively.

This calculated Isd response entirely overlaps with the expected fluorophores absorbance spectra, as measured by a spectrophotometer (Cary 5000 Spectrophotometer, FIG. 7B dashed lines). Altogether, the different RGBV SGFET nanodetectors show spectral-specific detection of the appropriate color, which is spectrally-tuned by the absorbance spectra of their surface-anchored fluorophores. The measured rise and decay times using the blue-SGFET devices, following blue excitation of about 120 mW×cm$^{-2}$ (FIG. 7C), are 6.1 s (with time constant $t_1$=2.3 s) and 35.6 s (with time constant $t_2$=15.9 s), respectively. The spectral specificity was tested of an ultra-small e-beam lithography fabricated SGFET device (20 nm diameter SiNW with an inter-electrode gap of 300 nm), to be potentially incorporated in sub-micron color detection applications (FIGS. 6A and 6F).

The results obtained from the ultra-small Alexa488-modified blue-SGFET nanodevice (FIGS. 13A-C) demonstrate high spectral specificity (FIG. 13A), as well as superior response and recovery times (FIG. 13B). Furthermore, SGFET devices display high optical as well as chemical stabilities, with minimal response reduction of <5% after 140.000, 2 seconds switching cycles at 40 mw×cm$^{-2}$ at ambient conditions (FIG. 14A).

Spectral-Specific Response Attained Via the Field Effect

To understand the effect underlining the observed increase in the electric current following spectral-specific fluorophore-mediated response, the electric properties of SGFETs were tested following spectral-specific excitation. To this end, red-SGFET (Alexa-610) nanodetector was excited with a 1.5 mW×cm$^{-2}$ red light source for different time durations, and the effect on the resulting I-V curves was measured (FIG. 7D). The shape of the $I_{sd}$/V curves following spectral-specific excitation exhibit similar response to that of applying an increasing negative $V_g$ biasing to an unmodified p-type device (FIG. 11B) which results in an increased conductivity.

The $V_{th}$ is defined as the minimum gate-to-source voltage differential needed to create a conducting path between the source and the drain terminals. The threshold voltage ($V_{th}$) change was calculated using sequential transconductance experiments, following red light excitation (2 mW×cm$^2$) of a red-SGFET (FIG. 7E, calculated from FIG. 15B) to evaluate the spectral-specific filed-effect gating. This gating effect is manifested by a shift in the $V_{th}$ as a function of excitation duration ranging from −5.5 V without illumination to −0.5 V following 60 s of red light excitation, implying an accumulation of negative charges at the SiNW surface, serving as a local negative gate bias. Electrical characterization of the spectral response of the blue-SGFET (FIG. 15A) nanodevice was repeated under different illumination intensities, in the 40-220 mJ×cm$_2$ range, using a blue xenon light source, resulting in a correlative response, similar to the change seen in the $V_{th}$ shift (FIG. 7E). The spectral specific response of the nanodevices was also tested at various $V_g$ biasing potentials ranging from −9.5V to 9.5V (FIG. 15C), and found a direct correlation which clearly demonstrate the field-effect based mechanism.

Implying, that at high negative bias, when the device is close to saturation, the effect of the spectral-specific effect is relatively small ($\Delta I_{sd}$=15 nA), whereas at high positive bias, close to the device depletion region, the spectral-specific effect is substantially larger ($\Delta I_{sd}$=50 nA). These experiments give good indication that the spectral specificity of the SGFET devices are attained via the field-effect mechanism.

To further investigate the source of the observed spectral-specific fluorophore-induced field effect, a series of surface potential mapping experiments was performed using Kelvin-probe microscopy (KPFM), in order to measure the surface potential change following spectral-specific excitation of the devices.

Samples were prepared by transferring Alexa-modified SiNWs on top of native oxide silicon wafer substrates, resulting in a dense arrangement of SiNWs. Alexa 555-modified SiNWs were used, and a 25 μm² area was scanned, while the topography of the same area was simultaneously examined (FIG. 8A). The atomic force microscopy (AFM) topography of the scanned area revealed several SiNWs, some lying flat in direct contact with the wafer surface (FIG. 8A, indicated by an arrow), while others stacked one on top of other NWs forming partially suspended SiNWs (FIG. 8A, indicated by an arrowhead). In parallel, KPFM surface potential was acquired, showing a uniform surface potential for the fluorophore-modified SiNWs (FIG. 8B).

Following 40 seconds of 546 nm wavelength illumination, at 200 mW×cm² (FIG. 8C), it can be seen that the SiNWs have gained a significant rise in their surface potential, about 60 mV (see graph, FIGS. 16A-D), while certain sections of the SiNWs, as well as the surrounding wafer areas, exhibit only a modest uniform potential rise. The sections of the SiNWs displaying increased surface potential upon wavelength-specific illumination are clearly identified in the topography scan as wires which are slightly elevated from the wafer surface. Note that each scan takes about 25 minutes, consequentially all non-retained charges will not be detected during the slow KPFM measurements. One hour post-illumination, an additional KPFM scan measurement shows that the accumulated charge was only detected at the most suspended SiNW sections, while it is completely lost from other non-suspended parts of the nanowires (FIG. 8D, indicated by an arrow and asterisk respectively).

Following spectral-specific excitation of fluorophore-modified p-type SiNWs devices, an elevation in the conductivity of the nanowires was observed, indicating a negative shift in electric potential of the SiNWs surface. KPFM measurements show that following spectral-specific excitation, there is a +60 mV shift in the electrical potential as detected at the surface of the fluorophore molecular layer decorating the SiNWs surfaces (FIG. 16D). This apparent contradiction can be resolved by the idea that photo-induced negative charges transfer from the fluorophore, at the outer molecular-layer surface of the chemically-modified device towards the SiNW oxide surface, resulting in a net positive electrical potential as detected by the KPFM measurements.

The results show the nature of the accumulated charge, which originates at the fluorophores, decorating the SiNWs surface, and translocate following spectral-specific excitation forming a negative charged electret-like layer at to the native $SiO_2$ surface.

Suspended SGFET as Nonvolatile Memory Elements

KPFM measurements suggest that fluorophore-modified suspended nanowire sections are capable to accumulate and hold negative electric charges following their spectral-specific excitation. To this end, suspended nanowire SGFET devices were tested (suspended FIG. 8E versus planar FIG. 6F). Electrical measurements of the current decay following spectral-specific excitation show a prolonged memory effect, which fully supports the KPFM observations (FIG. 8F). While the $I_{sd}$ current of planar SGFETs, reverts back to its original baseline value about 1 minute post-excitation (FIG. 7C), in suspended SGFET devices the light-induced elevated $I_{sd}$ current persists, and was found to be kept at about 2-3 folds above the baseline measurement for days post-excitation at ambient conditions (FIG. 8F, FIG. 9A for blue-SGFET, and FIG. 18 for green-SGFET).

Without being bound to any particular theory, this prolonged memory gating effect is attributed to the isolation of the suspended SGFET nanowire devices from the wafer surface, leading to the extended retention of light-induced negative charges at the nanowire surface. In planar SGFETs the close contact of the wire oxide with the wafer oxide promote recombination events leading to charge equilibrium and redistribution of electron along the wire and reintroducing of electron back into the fluorophore layer.

These memory elements are nonvolatile in nature, depending only on the field-effect gating, which persist also in the absence of any applied $V_{sd}$ potential (FIGS. 9A and 18).

Spectral Control of the ON and OFF States of the Suspended-Nanowire SGFET Nonvolatile Memory Devices Several optoelectronic applications require to efficiently control the ON and OFF states of a device. In most cases, this is done using broad-band illumination to reach the ON state and no illumination for the OFF state. However, this approach requires continues illumination through the ON state, which is highly power demanding, generating heat and noise sources. In other applications, the ON state is generated via pulse illumination, whereas the OFF state is achieved via high-voltage gate bias [35]. In this case the device is only semi-optically controlled. As describe above, following spectral-specific excitation, negative charges accumulate at the SiNW oxide layer, and cause elevation of the device $I_{sd}$ current. The accumulation of charges, in particular in suspended devices, results in a prolonged ON state that can persist for days at ambient conditions. It was found by the Inventors that UV illumination <390 nm (about 3.1 eV), cause a rapid reduction/elevation in the device $I_{sd}$ current in bare SiNW p-type/n-type FETs respectively (FIG. 19A).

Without being bound to any particular theory, this effect is attributed to the ionization and detrapping of electron in the $SiO_2$ layers which was shown to accrues at an initial energy of about 3.1 eV in others experimental systems [36,37], as well as in commercial application similarly to the effect seen in an erasable programmable read-only memory (EPROM) chip. FIG. 19A shows the wavelength dependence of the UV illumination effect on unmodified p-type and n-type SiNW FET devices, showing clearly that the UV light modulates the conductivity of the SiNWs, causing depletion of holes in p-silicon nanowires (FIG. 19A).

UV illumination acts as a positive bias, reducing conductivity in p-type SiNWs, resulting in an electrical OFF state. Combining UV illumination with the SGFET spectral-specific excitation properties allows the control of the 'on (write)'/'off (erase)' states of the nonvolatile memory elements, without the use of an electrical gate bias. As presented for the suspended blue-SGFET graph (FIGS. 9B-C, and for green-SGFET FIGS. 20A-B), following short UV illumination (365 nm, about 2 s), there is a rapid decrease in the $I_{sd}$ current of the device reaching the OFF state, while following spectral-specific blue excitation (488 nm, about 5 s) there is an elevation of the $I_{sd}$ current to the ON state.

The ON/OFF switching is maintained for multiple sequential UV/blue excitation cycles, at intervals of 10 min and 1 min (FIGS. 9B and 9C respectively), and for suspended green-SGFET (FIG. 20A and FIG. 20B, respectively). Similar experiments of sequential spectral-specific/UV excitation cycles were done also using n-type blue-SGFET devices (FIG. 19B), displaying opposite behavior to the p-type SGFETs, where the blue excitation causes reduction of the electrical $I_{sd}$ current, while UV illumination results in an elevation of the $I_{sd}$ current.

Single-Nanowire Dual-Pixel Nanodetector

Reducing the dimensions and complexity of color detection devices is of critical importance in future applications. For this purpose, multi-color single-nanowire devices were fabricated. These devices consist of a single-nanowire element, electrically coupled in a manner that allows the formation of multiple FETs on a single nanowire unit through the use of lithography means.

The subsequent site-specific, or FET segment-specific, chemically embedded with multiple fluorophores allows the formation of multi-color pixels along a single-nanowire, as illustrated in FIG. 10A. In this example, a dual-color detector device consisting on a single nanowire dual-FET, chemically-modified with Alexa-488 and Alexa-555 fluorophores was fabricated. Shortly, single-nanowire dual-FETs were fabricated, displaying an active channel length of 2 µm each. The site-selective fluorophores chemical modification was performed through the use of lithography-based masking and unmasking steps, as further detailed in the Supplementary Information section, below. The successful fabrication of the site-specific fluorophores-modified devices is shown in FIG. 10B.

It can be clearly observed that the dual-FET single nanowire devices are successfully site-specifically modified with two fluorophores, Alexa-488 (green fluorescence) and Alexa-555 (red fluorescence), each covering a different spectral range. These successful fabrication sequences allowed the creation of single-nanowire dual-pixel detector, as shown in FIGS. 10B and 10C (blue-green pixels) and FIGS. 10D and 10E (violet-red pixels). Important to note that Alexa 488 and Alexa 555 fluorophores display a considerably large spectral overlapping, (see FIG. 7B, absorbance), thus, this fact is expected to be directly reflected on the spectro-electrical behavior of the resulting color detector devices.

The dual-fluorophore single-nanowire detectors exhibit a clear spectral-specific response upon excitation at wavelengths of blue (460-500 nm), green (520-550 nm) and red (590-620 nm). Examining the temporal response curves, FIG. 10C, of the Alexa-555 segment (green pixel) versus the Alexa-488 segment (blue pixel) on the single-nanowire dual detector, demonstrates that green light excitation induce a considerable change in the $I_{sd}$ current of the respective green pixel detector, while only displaying a moderate current elevation for the blue pixel. Alternatively, blue excitation causes a fast and considerable change in the $I_{sd}$ current displayed by the blue pixel segment, while leading to smaller current changes shown by the green pixel segment device. Smaller current changes observed in these cases are attributed to the spectral overlapping of the chosen fluorophores.

Furthermore, red light excitation, outside the spectral range of the respective fluorophores, does not elicit a considerable change in the current of the FET segments of the blue-green single-nanowire dual-pixel device (FIG. 10C).

FIG. 10E shows the spectrally-selective electrical results of a similarly fabricated single-nanowire dual-pixel detector, modified with Alexa-430 and Alexa-610 fluorophores. These fluorophores display a considerable smaller spectral overlapping (FIG. 10E) in comparison to the blue/green dual-pixel devices (FIG. 10C). The effect of the reduced spectral overlap on the resulting electrical responses is evident, as expected. The large toolbox of available fluorophores allows the flexible design and fabrication of various spectral-specific detector combinations, with controllable spectral width, as well as improved spectral selectivity.

Model of Operation

Electrical TC analysis of bare as well as after fluorophore modified devices demonstrate large about −10V $V_{th}$ shift following SiNW device modifications (FIG. 21A). This imply the presence of positive charge dipole layer adjacent to the SiNW as a result of the APDMES and the fluorophore modification. Based on [38] an APDMES coverage of ~1.2× $10^{14}$ molecules/cm$^2$, and a surface coverage of 1×10$^{13}$ molecules/cm$^2$ of the Alexa fluorophores is assumed, resulting in mostly positive charged amine groups at the vicinity of the SGFETs. Analysis of bare SiNW FETs TC reveal a clockwise hysteresis, suggesting an oxide traps mediated field effect response [39] (FIG. 21B).

The following energy band diagram model can describe the spectral-specific writing/erasing process, as illustrated for p-type silicon SGFETs (FIG. 9D). FIG. 9D, illustration 1, shows the estimated energy band diagrams for unmodified bare SiNW FET with native oxide as the dielectric layer, consist of evenly distributed electron in the oxide traps. APDMES and fluorophore modification (FIG. 9D, illustration 2) forms a positive charged dipole at the surface of the SiNW which results in a shift of trapped electrons towards the outer surface of the oxide, producing band banding and the depletion of the wire conductive channel.

The corresponding HOMO-LUMO energy levels for the different RGBV (Alexa-610, 555, 488 and 430) fluorophores absorbance energy are indicted also in FIG. 9D illustration 2. Upon spectral-specific excitation (FIG. 9D, illustration 3), a photon is absorbed by the appropriate fluorophore, causing an excitation of an electron to its LUMO state. Some of these excited electrons are injected onto the SiO$_2$ surface where they accumulate pushing the trapped electrons towards the inner surface of the oxide forming a strong negative band bending.

This band bending causes an accumulation of holes in the SiNW adjacent to the Si—SiO$_2$ interface, which results in a large conducting channel and an elevation in the SiNW conductivity as well as a shift in the $V_{th}$ (FIG. 21C). In the case of planar SGFETs the device is relaxed back to its base state in a matter of seconds (FIG. 7C), whereas in the case of suspended SGFET, as previously described in (FIG. 8F), the electrons accumulated at the oxide surface persists for days at ambient conditions. UV illumination (FIG. 9D, illustration 4) induces ionization of electrons held in traps at the inner part of the oxide layer to the outer oxide layer and as a consequence reintroduce electrons back into the fluorophore layer, reverting the wire conductivity back to its state before fluorophore excitation. This repeated interplay between the fluorophores spectral-specific excited electrons and the UV oxide ionization allows control over the ON/OFF state of the SGFETs.

Supplementary Information

Materials

All fluorophores: Alexa 488 TFP, Alexa 555 NHS, Alexa 430 NHS, and Alexa 610 NHS were purchased from Molecular Probes (Thermo-Fisher Scientific). (3-aminopropyl)-dimethyl-ethoxysilane (APDMES) or (3-aminopropyl)-methyl-diethoxysilane (APMDES), poly-L-lysine and 20/80 nm diameter gold nanoparticles (AuNPs) were purchased from Gelest Inc and Ted Pella, respectively.

SiNWs Growth

Si nanowires (SiNWs) growth is described in detail in [41]. Briefly, all nanowires used in this work were grown by the VLS technique, using high-purity silane ($SiH_4$), high-purity argon as a carrier gas, and 20 or 80 nm diameter AuNPs serving as catalysts adhered to the growth substrate by a layer of poly-L-lysine. Nanowires were doped in situ with diborane ($B_2H_6$) for p-type nanowires, or phosphine ($PH_3$) for n-type nanowires. The resultant crystalline nanowires, with a final diameter of ca. 20 nm or 80 nm, and ca. 10-20 micrometers long, exhibit a smooth surface with a thin native silicon oxide layer (ca. about 3 nm), as confirmed by transmission electron microscopy.

Planar and 3D Suspended-SiNW Device Array Fabrication

For 3D-Suspended-SiNW devices, reactive ion etching (RIE) was used to etch a Si substrate and create an elevated pattern of the contacts at a depth of about 400 nm. SiNW-FET devices were fabricated as described in [40]. In short, p-type and n-type silicon nanowires of 20 nm and 80 n diameter were synthesized by chemical vapor deposition by the vapor-liquid-solid (VLS) method. Source and drain electrodes were fabricated aligned to the elevated contacts-area, by deposition of 300 nm LOR3A (Microchem) and 500 nm Shipley 1805 (Shipley) through spin-coating. After exposure and development of the electrode patterns using photolithography, contacts were metallized by e-beam and thermal evaporation of Ti/Pd/Ti (2/60/8 nm) respectively, and were passivated with an insulating layer of $Si_3N_4$ (100 nm-thick) deposited by plasma-enhanced chemical vapor deposition (ICP-PECVD, Axic Inc, USA). Prior to the chemical modification, chips were cleaned by oxygen plasma treatment at 100 Watts, 0.2 Torr $O_2$ for 60 s.

E-Beam Lithography

The chip (containing the Si nanowires) was spin-coated with EL9TM MMA resist (MicroChem) and A2TM PMMA resist (MicroChem). The electrode array was patterned on the resist layer by the use of a high-resolution e-beam lithography system (Raith GmbH, Dortmund, Germany). The electrode array was patterned at an energy of 30 kV and further developed in a MIBK/isopropyl alcohol (IPA) (1:3) bath for 1 minute, rinsed with isopropyl alcohol (IPA) for 10 s and dried with a nitrogen stream.

Amino-Silane Functionalization and Fluorophore Modification

Prior to the chemical modification, samples were cleaned by oxygen plasma treatment, 100 Watts, 0.2 Torr $O_2$ for 1-2 minutes. Chips were functionalized with undiluted APDMES for 1 hour at 70° C., followed by IPA wash. Amine-reactive derivatives of different Alexa fluoro-NHS esters were chemically functionalized using 200 μM solution of the fluorophore in DMSO at room temperature, following by washing with DMSO and DIW. For the multicolor detector chips, all fluorophores modification were done using an area-selective PDMS microfluidic system.

Multi-Color Single SiNW Detector

In order to obtain multi-color consist of a single SiNW detector device a FET array chip was fabricated where each device is made out of 2 parallel drain electrodes 6 μm apart which is separated by a common source electrode (as illustrated in FIG. 10A).

The fabrication process is illustrated in FIG. 22. Dry mechanically transferring of 20 nm SiNWs on to the chip surface as indicated above resulted in a single SiNW connected to the source electrode at its middle and were each side of the wire was connected to different drain electrode. The SiNWs were connected using a lithography step and titanium-palladium-titanium metal evaporation as described above. To allow spatial modification of the first side of the SiNW a 5 nm Alumina coating was deposited using ALD following by alumina etching (using aluminum etchant) in the area of a first wirer side which was defined by a lithography step. The first side of the wire was than modified using APDMES and a fluorophore. A second round of Alumina deposition was preformed following by a second lithography step and etching of the other side of the wire. The other side of the wire was than modified as well by APDMES and a second fluorophore. To complete the dual-color fabrication and the removal of the Alumina layers an 0.1M phosphoric acid was used. The fabrication resulted in a dual-color-specific single NW detector were each color detector is about 2 μm long at a total length of 6 μm.

Devices Electrical Characterization

IV measurements were taken for each device using a cryogenic four-probe station (Janis Research Co., Washington), at room temperature. The drain current ($I_{sd}$) response to the applied $V_{sd}$, varying between −0.5 V to +0.5 V, was measured at a constant back-gate voltage (from +−9 V to 9 V). The gate-dependent $I_{sd}$ (transconductance) of the devices was measured at a $V_{sd}$ of 0.4V for a varying back-gate Vg.

Light Sources

Laser scanning confocal LSM510 META microscope equipped with 633 nm (10 mW), 546 nm (10 mW) and 488 nm (7.5 mW) lasers was used. All lasers were set to 1% of their power output, unless otherwise indicated. Monochromatic light source (Polychromator IV, Till Photonics) was used for sequential excitation at the visible light spectrum (400 nm-700 nm) at a power 0.5-3 mW/cm$^2$, at an interval of 10-12 nm spectral bandwidth. Xenon 100 W LQ-XEAR 100DC (Leistungselektronik Jena GmbH) and 75 W mercury (Olympus) lamps were used in combination with the following bandpass filters: 365/10 nm, 430/24 nm, 480/40 nm, 535/30 nm, and 605/30 nm.

Spectral-Specific Light Detection

Qualified devices were wire-bonded (West-Bond 7476E, Anaheim, Calif.) to the outer pads of a chip PCB carrier. A commercial DC source unit (SM32P, FES Israel) was used for sensing at a 100 ms sampling rate. Detection results presented as $I_{sd}$ raw data or ($I_{sd}^{light}/I_{sd}^{dark}$) were calculated as the change of the device light normalized against the no-illumination (dark) condition, as the beginning of the experiments. The spectral-specific response was calculated from RGBV nanodetectors through spectral sweeping using the polychromator IV. In order to extract the responsive spectral regions where the devices conductivity is elevated, the $I_{sd}^{light}/I_{sd}^{dark}$ was Gaussian-fitted using Origin software (origin Lab), and the positive values of the 1$^{st}$ derivate were taken as the spectral responsiveness. All experiments were done under normal open air ambient conditions. The different Alexa fluorophores absorbance spectra was measured using a Cary 5000 Spectrophotometer, from bare and fluorophore-modified glass substrates, with an APDMES-modified glass substrate used as reference.

KPFM Measurements

KPFM measurements were done using a native oxide silicon wafer, dry-transferred with SiNWs, and a NT-MDT NTEGRA Spectra AFM/STM system, integrated with a spectroscopy system. Au-coated HQ:NSC15/CR-AU cantilevers were used for all the experiments. Tip curvature radius was about 35 nm, spring constant 2 N/m, resonance frequency about 325 kHz, and cantilever length 125 μm. Scan rate was 0.4 Hz at a scanning resolution of 256×256 pixels.

This Example presented a paradigm of filter-free color detection at the nanometric scale was presented in this Example. This concept is based on the inherent high sensitivity of SiNW FETs, in conjugation with the spectral-specific absorbance and photo-induced charge transfer of various molecular fluorophores. The SGFET devices can be used to distinguish between different colors at the violet-red spectrum, with a FWHM <100 nm bandwidth, which correlates to the absorbance spectra of the covalently-attached fluorophores. In this example, commercially available Alexa-fluorophore derivatives, which are known to be highly stable were used. However the use of other fluorophores which absorbs at different wavelengths, and which have higher tendency to transfer electrons, are also contemplated.

This Example demonstrates the nature of this spectral-sensitivity by measuring the change in the surface potential of the excited fluorophore-modified devices, and show that the spectral-specific modulation of the SGFETs conductivity is due to the spectrally-generated field effect. This Example presents a way by which the SGFETs can be controlled spectrally without the need for a physical gate bias, by using UV light, and be utilized to form spectrally-controlled memory elements from suspended SGFET devices. Alternatively, the fabrication of such devices on a thinner oxide surface could be potentially used to enable fast erasing, using high voltage back-gate pulses, in order to improve the decay time of the SGFETs.

Furthermore, this Example demonstrated the fabrication of small single-nanowire multi-pixel multicolor-specific detectors. The highly compact sub-micron SGFETs have the potential to be integrated into miniaturized optoelectronic applications, by virtue of their simple design. The present Inventors found that the chemical stability of the SGFETs can be grater enhance by the formation of a conformal ALD-based alumina thin shell, 8-15 nm thickness (FIG. 14B), shown to result in fluorophore-embedded nanowire hybrid structures of remarkably high chemical stabilities under the harshest tested conditions, while maintaining the spectro-electrical activity of the devices and the spectroscopic attributes of the embedded fluorophore molecules (see FIGS. 14C-F).

This type of compact optoelectronic devices would be of interest also in biological applications, to serve for example as in vivo fluorescent-signal detection or as a color-sensitive artificial retina implants. At their Alumina nano-encapsulation configuration, the SGFETs can also operate under solution conditions and physiological conditions. These will allow to extent the SGFETs capabilities to be incorporated into diverse bio-optoelectronic applications, where such compact sensors are highly required.

Example 2

Following is a description of specific configurations that can be employed according to some embodiments of the present invention.

FIGS. 23A and 23B are a schematic illustration (FIG. 23A) and image (FIG. 23B) of a filter-free stacked color detector, according to some embodiments of the present invention. RGB color detector consist of 3 or more planar SiNWs detector chips are stacked one on top of the other and are aliened, preferably to achieve maximum overlapping between the color detector in each chip. Each glass chip is optionally and preferably modified using different Alexa fluorophore (e.g., Alexa488, Alexa555 and Alexa610). This 3D architecture can be used to achieve very small pixel size for the three or more different colors (e.g., RGB), without the need of a superimposing color filter. An exemplified device was designed using 3 similar SiNWs, planar, color-specific detector chips and were fabricated on a glass wafer.

FIG. 24 is a schematic illustration of an optoelectronic system 240, which comprises a semiconductor substrate 242 having a p region 244 and an n region 246 forming a p-n junction 248 therebetween. Substrate 242 can be made of any of the aforementioned semiconductor materials. System 240 can further comprise an insulating layer 250 on substrate 242 above p-n junction 248. Typically, but not necessarily layer 250 is an oxide or nitride layer, preferably an oxide or nitride that is compatible with the material forming substrate 242. For example, when substrate 242 comprises silicon, layer 250 can be a silicon oxide or silicon nitride. Other example include, without limitation, silicon oxynitride, aluminum oxide, aluminum oxynitride, hafnium oxynitride, hafnium aluminum oxide, hafnium silicon oxide, hafnium silicon oxynitride, zirconium silicate, hafnium dioxide and zirconium dioxide and the like.

System 240 typically also comprises a layer 252 of light sensitive moieties on layer 250. The light sensitive moieties comprise any of the molecules as defined and exemplified herein. The moieties can be covalently attached to layer 250 or deposited on layer 250. Upon interaction of the light sensitive moieties of layer 252 with light having a central wavelength in their absorbance spectrum, layer 250 is charged as further detailed hereinabove. The charging process can be inverted to restore the electrical state of layer 252, for example, by illuminating system 240 by ultraviolet light as demonstrated in Example 1 above. Thus, when the light in the absorbance spectrum, layer 252 assumes an ON state, and when the light is an ultraviolet light layer 252 assumes an OFF state.

Optionally and preferably the charging state of layer 250 can be read using source electrode 14 and a drain electrode 18, as further detailed hereinabove. Typically, a voltage is applied between electrodes 14 and 18 and the source-drain current is detected, wherein the level of the source-drain current is indicative of the charge state of layer 250.

System 240 can include two or more cells with light sensitive moieties characterized by different absorbance spectra. FIG. 24 illustrates an embodiment in which system 240 comprises three cells, wherein a first cell comprising moieties having absorbance spectrum which is predominantly red, a second cell comprising moieties having absorbance spectrum which is predominantly green, and a third cell comprising moieties having absorbance spectrum which is predominantly blue. Other absorbance spectra are also contemplated as further detailed hereinabove.

FIG. 25 is a schematic illustration of an optoelectronic system 260, which comprises a semiconductor substrate 242 between a first layer 252a of light sensitive moieties, and a second layer 252b of light sensitive moieties. Typically, system 260 also comprises a first insulating 250a between substrate 242 and layer 252a and/or a second insulating 250b between substrate 242 and layer 252b. One or both layers 250*a* and 250*b* can be an oxide or nitride layer as further detailed hereinabove, or an organic coating which may comprise, for example, poly(methyl methacrylate) (PMMA) or polycarbonate or the like. The absorbance spectrum of the moieties in layer 252*a* is optionally and preferably, but not necessarily, different from the absorbance spectrum of the moieties in layer 252*b*. Layer 252*b* is optionally and preferably embedded in or deposited on an inversion layer 254 selected to invert a response of semiconductor substrate 242 to the interaction of layer 252*b* with light having a central wavelength in its absorbance spectrum. For example, layer 252*b* can be deposited on or embedded in an alumina layer which inverts the charging effect of layer 252*b*, as demonstrated in Example 1, above. Thus, when light having a wavelength in the absorbance spectrum of layer 252*a* arrives at system 260 to interact with layer 252*a*, layer 242 assumes an ON state, and when light having a wavelength in the absorbance spectrum of layer 252*b* arrives at system 260 to interact with layer 252*b* layer 242 assumes an OFF state. While the embodiments above are described with a particular emphasis to an inversion layer 254 which is, or comprises alumina, it is to be understood that other materials for inversion layer 254 are also contemplated in some embodiments of the present invention.

Optionally and preferably the charging state of layer 242 can be read using source electrode 14 and a drain electrode 18, as further detailed hereinabove. Typically, a voltage is applied between electrodes 14 and 18 and the source-drain current is detected, wherein the level of the source-drain current is indicative of the charge state of layer 242.

Systems 240 and 260 can be incorporated in many optoelectronic apparatus, including, without limitation, an imager, an optical memory medium, an optical switch, an optoelectronic demodulator and an optoelectronic multiplexer.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

REFERENCES

[1] Lim, S.-J. et al., 2015, Organic-on-silicon complementary metal-oxide-semiconductor colour image sensors. Scientific Reports 5, 7708,

[2] Lee, K.-H. et al., 2014, Dynamic Characterization of Green-Sensitive Organic Photodetectors Using Nonfullerene Small Molecules: Frequency Response Based on the Molecular Structure. The Journal of Physical Chemistry C 118, 13424-13431,

[3] Lyons, D. M. et al., 2014, Narrow band green organic photodiodes for imaging. Organic Electronics 15, 2903-2911

[4] Nishiwaki, S., Nakamura, T., Hiramoto, M., Fujii, T. & Suzuki, M.-a. 2013, Efficient colour splitters for high-pixel-density image sensors. Nat Photon 7, 248-254

[5] Sobhani, A. et al., 2011, Narrowband photodetection in the near-infrared with a plasmon-induced hot electron device. Nat Commun 4, 1643

[6] Klekachev, A. V. et al., 2011, Electron accumulation in graphene by interaction with optically excited quantum dots. Physica E: Low-dimensional Systems and Nanostructures 43, 1046-1049

[7] Konstantatos, G. et al., 2012, Hybrid graphene-quantum dot phototransistors with ultrahigh gain. Nat Nano 7, 363-368,

[8] Lin, Q., Armin, A., Burn, P. L. & Meredith, P. Filterless, 2015, narrowband visible photodetectors. Nat Photon 9, 687-694

[9] Fang, Y., Dong, Q., Shao, Y., Yuan, Y. & Huang, J., 2015, Highly narrowband perovskite single-crystal photodetectors enabled by surface-charge recombination. Nat Photon 9, 679-686

[10] Krivitsky, V. et al. Si Nanowires Forest-Based On-Chip Biomolecular Filtering, Separation and Preconcentration Devices: Nanowires Do it All. Nano Letters 12, 4748-4756, (2012)

[11] Kwiat, M. et al. Non-covalent Monolayer-Piercing Anchoring of Lipophilic Nucleic Acids: Preparation, Characterization, and Sensing Applications. Journal of the American Chemical Society 134, 280-292, (2012)

[12] Kwiat, M. et al. Highly Ordered Large-Scale Neuronal Networks of Individual Cells—Toward Single Cell to 3D Nanowire Intracellular Interfaces. ACS Applied Materials & Interfaces 4, 3542-3549, (2012)

[13] Patolsky, F., Zheng, G. & Lieber, C. M. Nanowire-Based Biosensors. Analytical Chemistry 78, 4260-4269, (2006)

[14] Engel, Y. et al. Supersensitive detection of explosives by silicon nanowire arrays. Angew Chem Int Ed Engl 49, 6830-6835, (2010)

[15] Lichtenstein, A. et al. Supersensitive fingerprinting of explosives by chemically modified nanosensors arrays. Nat Commun 5, (2014)

[16] Elnathan, R. et al. Biorecognition layer engineering: overcoming screening limitations of nanowire-based FET devices. Nano Lett 12, 5245-5254, (2012)

[17] Livi, P. et al. Monolithic integration of a silicon nanowire field-effect transistors array on a complementary metal-oxide semiconductor chip for biochemical sensor applications. Anal Chem 87, 9982-9990, (2015)

[18] Peretz-Soroka, H. et al. Optically-gated self-calibrating nanosensors: monitoring pH and metabolic activity of living cells. Nano Lett 13, 3157-3168, (2013)

[19] Peretz-Soroka, H. et al. Manipulating and Monitoring On-Surface Biological Reactions by Light-Triggered Local pH Alterations. Nano Lett 15, 4758-4768, (2015)

[20] Zheng, G., Patolsky, F., Cui, Y., Wang, W. U. & Lieber, C. M., 2005, Multiplexed electrical detection of cancer markers with nanowire sensor arrays. Nat Biotech 23, 1294-1301

[21] Shpaisman, N., Givan, U. & Patolsky, F. Electrochemical synthesis of morphology-controlled segmented CdSe nanowires. ACS Nano 4, 1901-1906, (2010)

[22] Peled, E. et al. Tissue-like Silicon Nanowires-Based Three-Dimensional Anodes for High-Capacity Lithium Ion Batteries. Nano Lett 15, 3907-3916, (2015)

[23] Elnathan, R., Kwiat, M., Patolsky, F. & Voelcker, N. H. Engineering vertically aligned semiconductor nanowire arrays for applications in the life sciences. Nano Today 9, 172-196, (2014)

[24] Pevzner, A. et al. Confinement-Guided Shaping of Semiconductor Nanowires and Nanoribbons: "Writing with Nanowires". Nano Letters 12, 7-12, (2012)

[25] Peled, A., Pevzner, A., Peretz Soroka, H. & Patolsky, F. Morphological and chemical stability of silicon nanostructures and their molecular overlayers under physiological conditions: towards long-term implantable nanoelectronic biosensors. J Nanobiotechnology 12, 7, (2014)

[26] Pevzner, A. et al. Unwrapping core-shell nanowires into nanoribbon-based superstructures. Angew Chem Int Ed Engl 52, 11298-11302, (2013)

[27] Cui, Y., Duan, X., Hu, J. & Lieber, C. M. Doping and Electrical Transport in Silicon Nanowires. The Journal of Physical Chemistry B 104, 5213-5216, (2000)

[28] Kwiat, M., Cohen, S., Pevzner, A. & Patolsky, F. Large-scale ordered 1D-nanomaterials arrays: Assembly or not? Nano Today 8, 677-694, (2013)

[29] Pevzner, A. et al. Knocking Down Highly-Ordered Large-Scale Nanowire Arrays. Nano Letters 10, 1202-1208, (2010)

[30] Baek, E. et al. Optoelectronic switching of nanowire-based hybrid organic/oxide/semiconductor field-effect transistors. Nano Research 8, 1229-1240, (2015)

[31] Ha, T. & Tinnefeld, P. Photophysics of Fluorescent Probes for Single-Molecule Biophysics and Super-Resolution Imaging. Annual Review of Physical Chemistry 63, 595-617, (2012)

[32] Bernas, T., Asem, E. K., Robinson, J. P., Cook, P. R. & Dobrucki, J. W. Confocal Fluorescence Imaging of Photosensitized DNA Denaturation in Cell Nuclei. Photochemistry and Photobiology 81, 960-969, (2005)

[33] Zondervan, R., Kulzer, F., Orlinskii, S. B. & Orrit, M. Photoblinking of Rhodamine 6G in Poly(vinyl alcohol): Radical Dark State Formed through the Triplet. The Journal of Physical Chemistry A 107, 6770-6776, (2003)

[34] Kim, Y. L. et al., 2014, Voltage-switchable photocurrents in single-walled carbon nanotube-silicon junctions for analog and digital optoelectronics. Nat Photon 8, 239-243

[35] Tan, H. et al. An optoelectronic resistive switching memory with integrated demodulating and arithmetic functions. Adv Mater 27, 2797-2803, (2015)

[36] Fedoseenko, S. I., Adamchuk, V. K. & Afanas'ev, V. V. Silicon clusters as photoactive traps in buried oxide layers of SIMOX structures. Microelectronic Engineering 22, 367-370, (1993)

[37] Gritsenko, V. & Wong, H. Atomic and Electronic Structures of Traps in Silicon Oxide and Silicon Oxynitride. Critical Reviews in Solid State and Materials Sciences 36, 129-147, (2011)

[38] Peretz-Soroka, H. et al. Manipulating and Monitoring On-Surface Biological Reactions by Light-Triggered Local pH Alterations. Nano Letters 15, 4758-4768, (2015)

[39] Lei, B. et al. Nanowire transistors with ferroelectric gate dielectrics: Enhanced performance and memory effects. Applied Physics Letters 84, 4553-4555, (2004)

[40] Kwiat et al., 2012, ACS Applied Materials & Interfaces 4(7):3542-49

[41] Patolsky et al., Nat Protoc 1(4):1711-24

What is claimed is:

1. A light sensor, comprising a nanostructure connectable to a source electrode and a drain electrode, and light sensitive moiety covalently attached to a surface of said nanostructure, said light sensitive moiety comprising a light sensitive molecule having an absorbance spectrum in a visible range, said light sensitive molecule being selected such that upon irradiation of the light sensor by light having a central wavelength within said absorbance spectrum, said sensitive molecule transfers or extracts an electron to or from said surface of said nanostructure.

2. The light sensor of claim 1, comprising a plurality of nanostructures, wherein at least two of said nanostructures are covalently attached to light sensitive moieties comprising light sensitive molecules having different absorbance spectra.

3. The light sensor of claim 2, wherein said at least two nanostructures are connected to different source electrodes and/or different drain electrodes.

4. The light sensor of claim 2, having a layered structure, wherein said at least two nanostructures occupy different layers in said layered structure.

5. The light sensor of claim 2, wherein said at least two nanostructures engage the same plane.

6. The light sensor of claim 1, wherein said nanostructure is inorganic.

7. The light sensor of claim 1, wherein said nanostructure comprises a semiconductor material.

8. The light sensor of claim 1, wherein said semiconductor material comprises silicon.

9. The light sensor of claim 1, wherein said nanostructure is aligned horizontally on a substrate.

10. The light sensor of claim 1, wherein said nanostructure is suspended horizontally above a substrate.

11. The light sensor of claim 1, wherein said nanostructure and said attached light sensitive moiety are embedded in a protective layer.

12. The light sensor of claim 1, wherein said light sensitive molecule is a fluorophore molecule.

13. The light sensor of claim 1, wherein there is a plurality of light sensitive moieties covalently attached to said surface of said nanostructure, and wherein at least two of said light sensitive moieties comprise light sensitive molecules having different absorbance spectra.

14. An optical memory, comprising the light sensor of claim 1.

15. An optical switch, comprising the light sensor of claim 1.

16. An artificial retina, comprising the light sensor of claim 1.

17. An optoelectric modulator, comprising the light sensor of claim 1.

18. A multiplexer, comprising the light sensor of claim 1.

19. An imaging system, comprising the light sensor of claim 1.

20. The light sensor of claim 1, wherein said absorbance spectrum is characterized by a full width at half-maximum of less than 200 nm.

21. The light sensor of claim 1, wherein said absorbance spectrum is characterized by a full width at half-maximum of less than 100 nm.

22. A method of sensing light, comprising directing light to a light sensor and measuring current between the electrodes, wherein said light sensor comprises a source electrode, a drain electrode, a nanostructure connected between said electrodes, and a light sensitive moiety covalently attached to a surface of said nanostructure, said light sensitive moiety comprising a light sensitive molecule having an absorbance spectrum in a visible range, said light sensitive molecule being selected such as to transfer or extract an electron to or from said surface of said nanostructure responsively to said light.

23. The method of claim 22, wherein said light sensor comprises a plurality of nanostructures, wherein at least two of said nanostructures are covalently attached to light sensitive moieties comprising light sensitive molecules having different absorbance spectra.

24. The method of claim 23, wherein said at least two nanostructures are connected to different source electrodes and/or different drain electrodes.

25. The method of claim 23, wherein said light sensor has a layered structure, wherein said at least two nanostructures occupy different layers in said layered structure.

26. The method of claim 23, wherein said at least two nanostructures engage the same plane.

27. The method of claim 23, wherein said light sensor has a layered structure, wherein said at least two nanostructures occupy different layers in said layered structure.

28. The method of claim 23, wherein said at least two nanostructures engage the same plane.

29. The method of claim 22, wherein said light sensor comprises a plurality of nanostructures.

30. A method of switching, comprising:
providing a light sensor having a source electrode, a drain electrode, a nanostructure connected between said electrodes, and a light sensitive moiety covalently attached to a surface of said nanostructure, said light sensitive moiety comprising a light sensitive molecule having an absorbance spectrum in a visible range;
directing light having a first central wavelength to said light sensor to effect a change in electrical conductance of said nanostructure; and
directing light having a second central wavelength to said nanostructure to reverse said change in said electrical conductance.

31. The method of claim 30, wherein said first central wavelength is in the visible range and said second central wavelength is in an ultraviolet range.

32. An optoelectronic system, comprising:
a semiconductor substrate having a p region and an n region forming a p-n junction therebetween;
an insulating layer on said substrate above said p-n junction; and
a layer of light sensitive moieties having an absorbance spectrum deposited on said insulating layer, such that said insulating layer is charged responsively to interaction of said light sensitive moieties with light having a central wavelength in said absorbance spectrum;
wherein for at least one of said light sensitive moieties, said absorbance spectrum is characterized by a full width at half-maximum of less than 200 nm.

33. An optoelectronic system, comprising a semiconductor substrate between a first layer of light sensitive moieties comprising light sensitive molecules having a first absorbance spectrum, and a second layer of light sensitive moieties comprising light sensitive molecules having a second absorbance spectrum, said second layer of light sensitive moieties being embedded in or deposited on an inversion layer selected to invert a response of said semiconductor substrate to an interaction of said second layer with light having a central wavelength in said second absorbance spectrum.

* * * * *